US012615792B2

(12) United States Patent
Hirose et al.

(10) Patent No.: US 12,615,792 B2
(45) Date of Patent: Apr. 28, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Masafumi Hirose, Tokyo (JP); Hitoshi Matsuura, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 372 days.

(21) Appl. No.: 18/353,261

(22) Filed: Jul. 17, 2023

(65) Prior Publication Data

US 2024/0088275 A1 Mar. 14, 2024

(30) Foreign Application Priority Data

Sep. 12, 2022 (JP) ................................ 2022-144245
Jul. 3, 2023 (JP) ................................ 2023-109122

(51) Int. Cl.
| | |
|---|---|
| *H10D 12/00* | (2025.01) |
| *H10D 12/01* | (2025.01) |
| *H10D 62/10* | (2025.01) |
| *H10D 62/53* | (2025.01) |
| *H10D 64/23* | (2025.01) |

(52) U.S. Cl.
CPC ......... *H10D 12/481* (2025.01); *H10D 12/038* (2025.01); *H10D 62/106* (2025.01); *H10D*

*62/107* (2025.01); *H10D 62/127* (2025.01); *H10D 62/53* (2025.01); *H10D 64/232* (2025.01)

(58) Field of Classification Search
CPC .. H10D 12/481; H10D 62/106; H10D 62/107; H10D 62/53; H10D 64/232
See application file for complete search history.

(56) References Cited

U.S. PATENT DOCUMENTS

| | | | |
|---|---|---|---|
| 10,505,029 B2 | 12/2019 | Nagata | |
| 2019/0035920 A1* | 1/2019 | Nagata .................. | H10D 64/23 |
| 2020/0395215 A1* | 12/2020 | Kubouchi ............ | H10D 62/106 |

FOREIGN PATENT DOCUMENTS

JP 2019-029434 A 2/2019

* cited by examiner

*Primary Examiner* — Daniel P Shook
(74) *Attorney, Agent, or Firm* — Rimon P.C.

(57) ABSTRACT

Techniques are provided for suppressing the accumulation of holes in floating region and improving the switching time of a semiconductor device such as an Insulated Gate Bipolar. The semiconductor device includes a trench gate and a trench emitter formed in a semiconductor substrate, and a floating region of a first conductivity type formed in the semiconductor substrate sandwiched between the trench gate and the trench emitter. The bottom of the floating region is located below the bottom of the trench gate and the trench emitter, and the floating region has a crystal defect region including crystal defects selectively formed at a position near an upper surface of the semiconductor substrate in the floating region.

10 Claims, 22 Drawing Sheets

GGEE

FIG. 1

GGEE

*FIG. 8*

| Tte (ds) | Evr |
|---|---|
| 1min (~1μm) | |
| 2min (~2μm) | |
| 3min (~3μm) | |

SEMICONDUCTOR DEVICE AND METHOD OF MANUFACTURING THE SAME

CROSS-REFERENCE TO RELATED APPLICATIONS

The disclosure of Japanese Patent Application No. 2022-144245 filed on Sep. 12, 2022, and the disclosure of Japanese Patent Application No. 2023-109122 filed on Jul. 3, 2023, including the specification, drawings and abstract is incorporated herein by reference in its entirety.

BACKGROUND

The present disclosure relates to a semiconductor device, and more particularly, to a technique applicable to a power-based semiconductor device such as an insulated gate bar polar transistor (IGBT: Insulated Gate Bipolar Transistor) having a trench gate and a floating region.

As the insulated-gate bipolar transistor (IGBT), an IE-type IGBT that can utilize an IE (Injection Enhancement) effect has been developed. The IE effect is an effect of decreasing the on-voltage of the IGBT by increasing the density of charges accumulated in a drift layer by making it difficult for holes to be discharged when the IGBT is in the on-state. Such IE type IGBT include a GG type structure, a GGEE type structure, and a GE-S type structure (see Japanese Patent Laid-Open No. JP-A-2019-029434).

SUMMARY

The IE type IGBT include the GG type structure, the GGEE type structure, and the GE-S type structure, a floating region may be located between trench electrodes. For example, in a case of the GG type structure, a floating region is located between a pair of trench gates, in a case of the GGEE type and the GE-S type structures, a floating region is located between a trench gate and a trench emitter. There are affected IGBT switching time not only a drift layer structure but also ease of discharge of holes accumulated in the floating region between such the trench electrodes. In order to further enhance the switching characteristics of IGBT, it is necessary to control a hole accumulation effect on the floating region.

The present disclosure provides a technique for controlling the accumulation of holes in the floating region and improving the switching time of the semiconductor device such as insulated-gate bar polar transistor.

Other objects and novel features will become apparent from the description of this specification and the accompanying drawings.

An outline of representative ones of the present disclosure will be briefly described below.

A semiconductor device according to an embodiment is provided. A trench gate and a trench emitter which are formed in a semiconductor substrate and extend in a first direction in a plan view and are adjacent to each other in a second direction orthogonal to the first direction in a plan view. A floating region of a first conductivity type formed in the trench gate and a region opposite to a direction in which the trench emitter is formed. A base region of the first conductivity type formed in the base region, an emitter region of the first conductivity type opposite to a second conductivity type, contact members formed in the emitter region and the base region, and the emitter region and the base region an emitter electrode is provided. The trench gate includes a first electrode electrically connected to a gate electrode, the trench emitter includes a second electrode electrically connected to the emitter electrode, a bottom portion of the floating region is located below a bottom portion of the trench gate and the trench emitter, and the floating region has a crystal defect region on a surface side of the floating region.

According to the semiconductor device of the above embodiment, it is possible to control the accumulation of holes in the floating regions and improve the switching time.

BRIEF DESCRIPTION OF THE DRAWINGS

FIG. 1 is an entire plan view of a semiconductor chip according to a present embodiment.

FIG. 8 is a diagram for explaining an evaluation result of crystal defects according to the embodiment.

DETAILED DESCRIPTION

Figure 2:
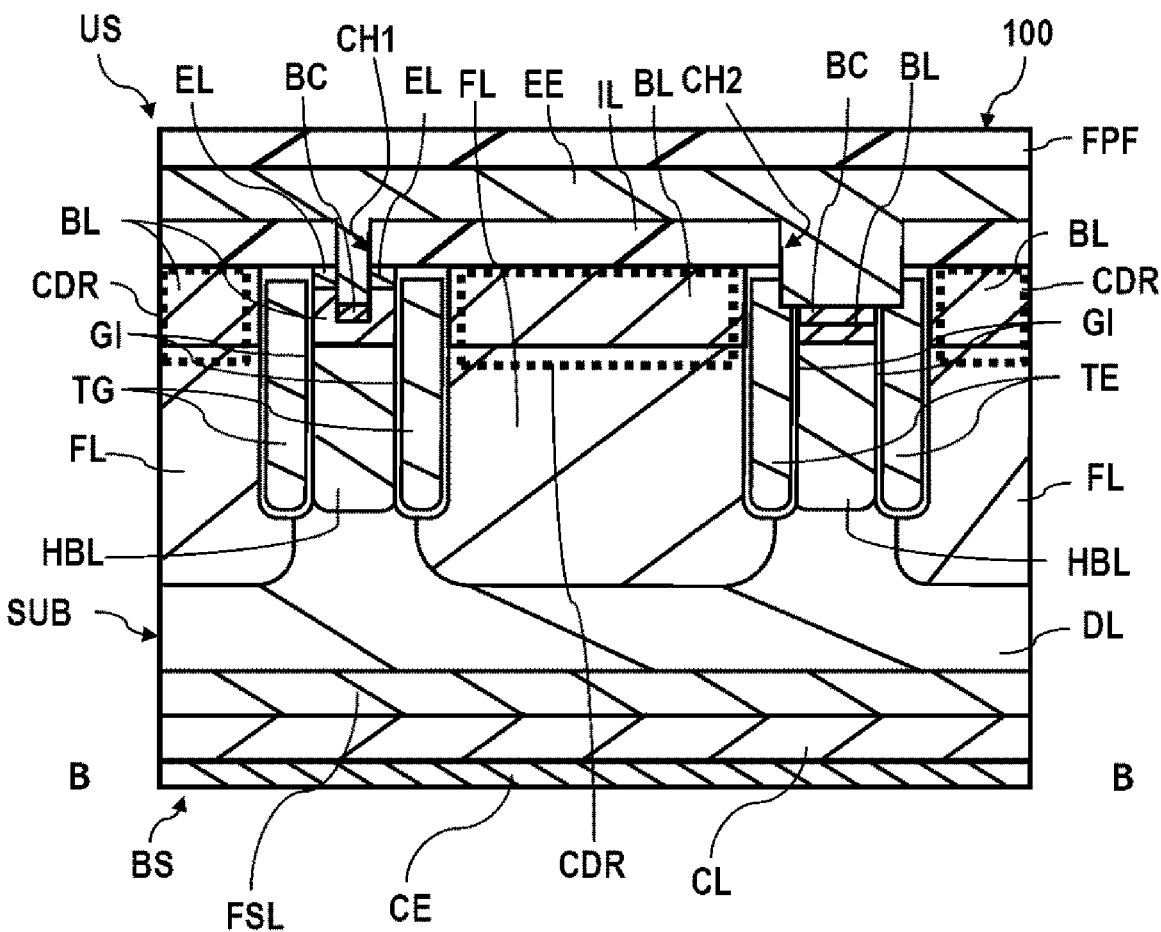
FIG. 2 is a main portion cross-sectional view of a cell region RR shown in FIG. 1.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, the constituent elements (including the element steps and the like) are not essential except for the case where they are particularly explicitly described and the case where they are considered to be absolutely necessary in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiment will be described in detail based on the drawings. In addition, in all the drawings for explaining the embodiments, members having the same functions are denoted by the same reference numerals, and repetitive descriptions thereof are omitted. It should be noted that the drawings may be represented schematically in comparison with actual embodiments for the sake of clarity of explanation, but are merely an example and do not limit the interpretation of the present invention. In the following embodiments, descriptions of the same or similar parts will not be repeated in principle except when particularly necessary.

In the drawings used in the embodiments, hatching may be omitted in order to make the drawings easier to see.

In this application specification, the p-type conductivity means that the concentration of the holes is higher than the concentration of the electrons, and the holes are the main charge carriers. The p-type semiconductor means a semiconductor region containing impurities such as boron and gallium. In this application specification, the n-type conductivity means that the concentration of the electrons is higher than the concentration of the holes, and the electrons are the main charge carriers. In addition, the n-type semiconductor means a semiconductor region containing impurities such as phosphorus and arsenic.

In this specification, the switching operation in which the IGBT is switched from the off state to the on state is referred to as "turn-on", and the switching operation in which the IGBT is switched from the on state to the off state is referred to as "turn-off". It should be noted that these switches do not occur in a moment, and may include a plurality of stages having temporal order relations, including external circuitry to which IGBT is connected.

Hereinafter, a semiconductor device according to an embodiment will be described referring to the drawings. A semiconductor device 100 of a present embodiment includes, for example, a semiconductor chip CHP having an IGBT.

Figure 1:
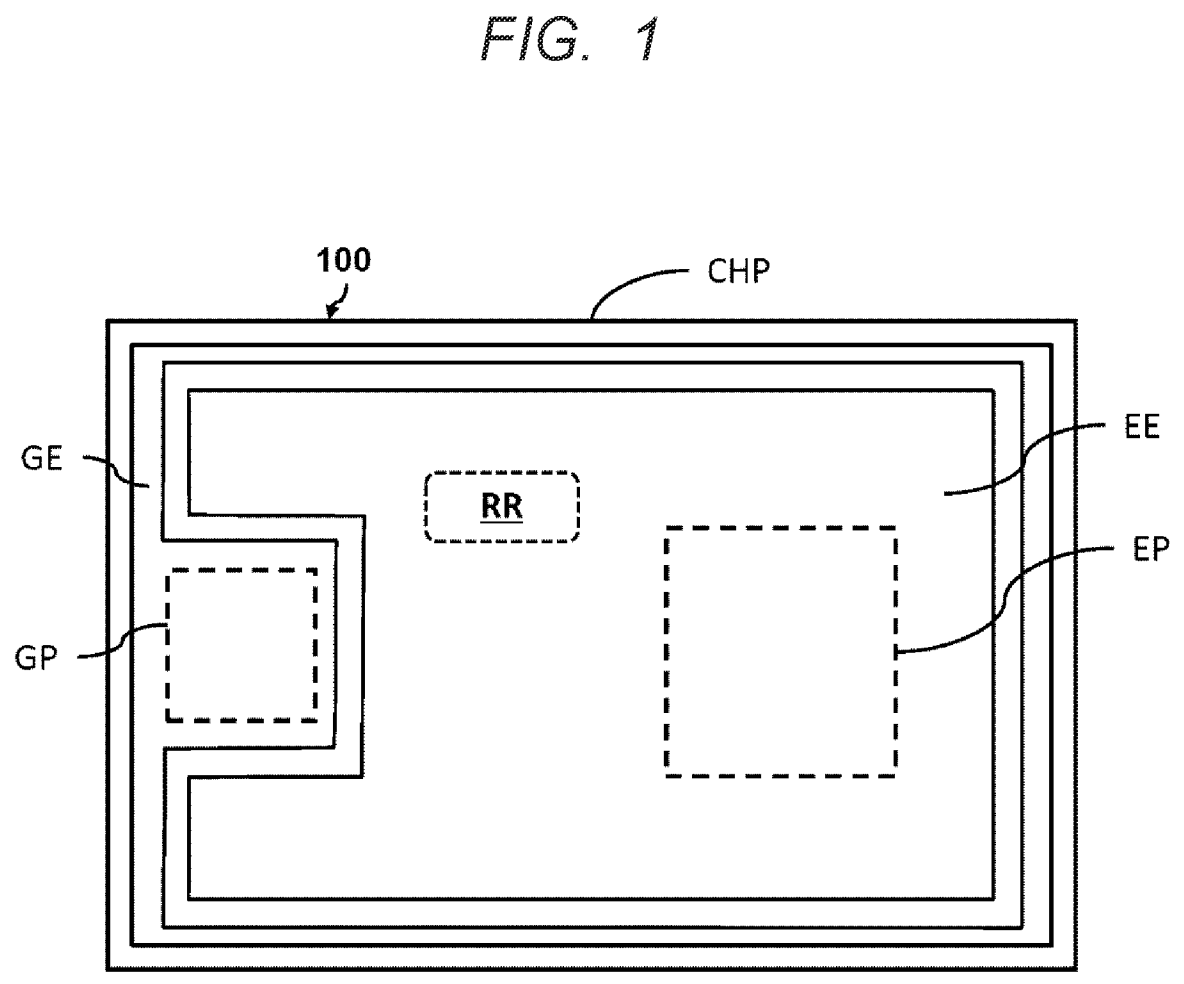

FIG. 1 is an entire plan view of the semiconductor chip CHP according to a present embodiment. As shown in FIG. 1, most of the semiconductor chip CHP of the semiconductor device 100 is covered with an emitter electrode EE. Further, a gate electrode GE is formed around the emitter electrode EE so as to surround the emitter electrode EE. A region surrounded by a broken line near the center of the emitter electrode EE is an emitter pad EP, and a region surrounded by a broken line of the gate electrode GE is a gate pad GP. The upper surface of the semiconductor chip CHP is covered with a protective film PIQ (not shown in FIG. 1), but the protective film PIQ is removed from the upper surfaces of the emitter pad EP and the gate pad GP. External connection terminals such as wire bindings or clips are connected to the emitter pad EP and the gate pad GP, and the semiconductor chip CHP is electrically connected to another chip or a wiring substrate through the external connection terminals.

Configuration Example 1 of the GGEE Type Structure

Figure 3:
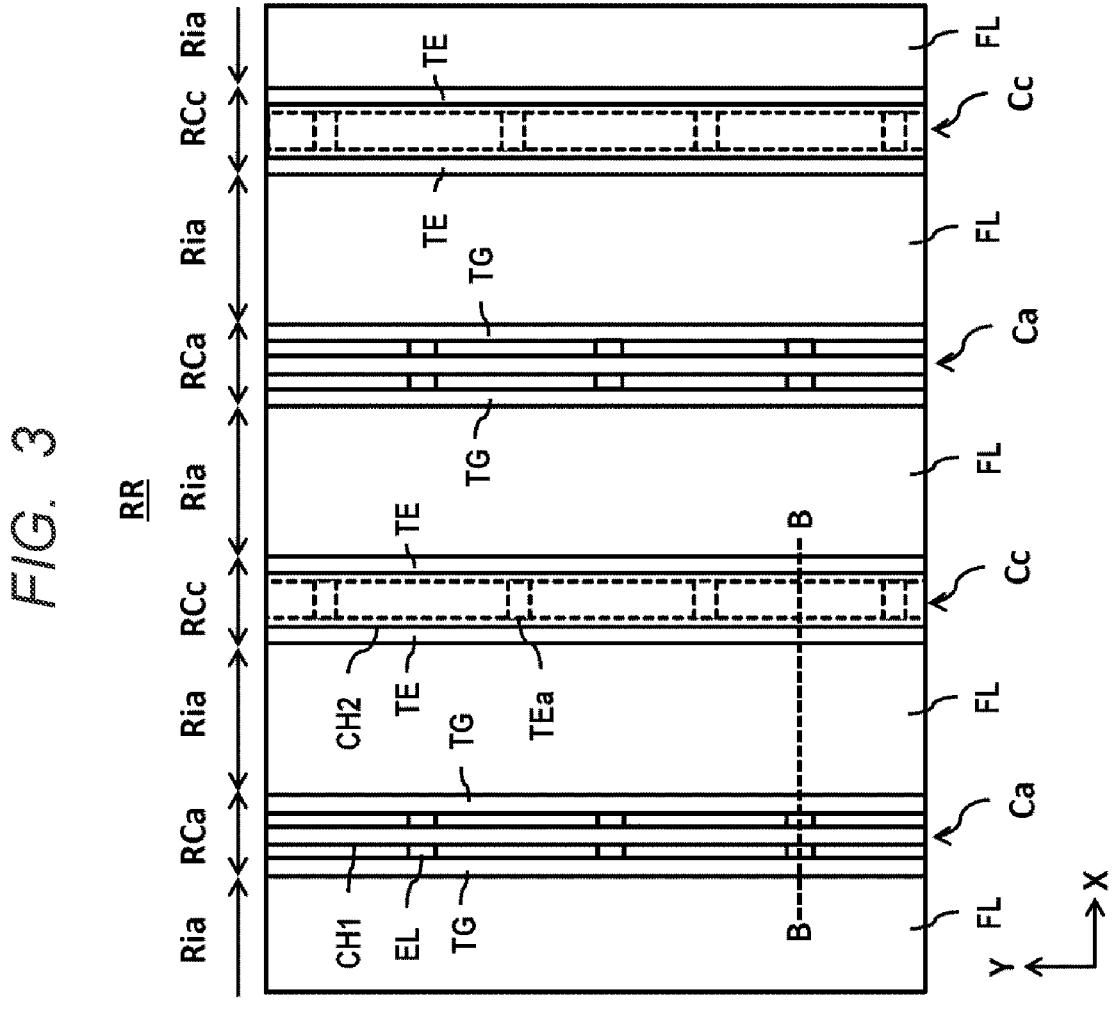
FIG. 3 is a main portion plan view of the cell region RR of FIG. 1.
Figure 4:
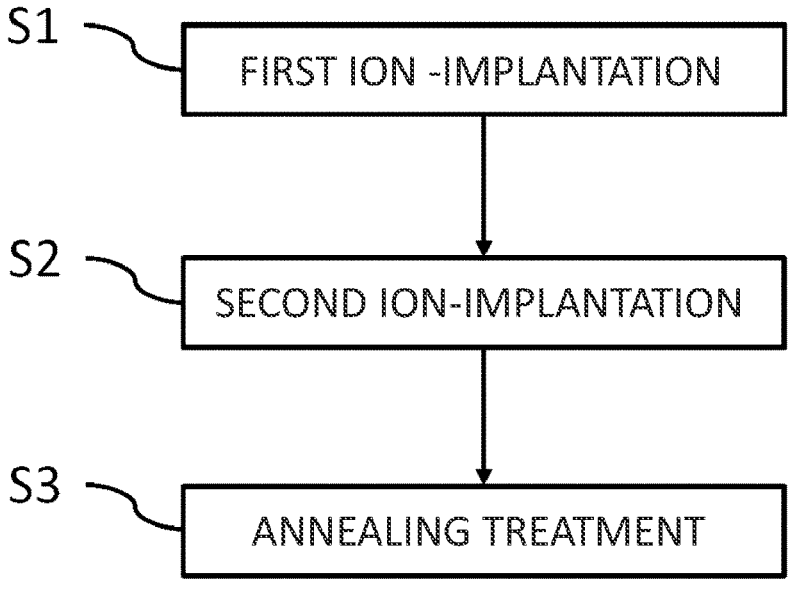
FIG. 4 is a flow chart for explaining a manufacturing method of a floating region FL according to the embodiment.

FIG. 2 is a main portion cross-sectional view of a cell region RR shown in FIG. 1. FIG. 3 is a main portion plan view of the cell region RR of FIG. 1. And FIG. 4 is a flow chart for explaining a manufacturing method of a p-type floating region FL according to the embodiment.

As shown in FIG. 2, the semiconductor device including IE type IGBT 100 has a GGEE type cell structure. The GGEE type cell structure includes a n-type silicon substrate SUB having a first main surface US, a trench gate TG, a trench emitter TE, a p-type base region BL, an n-type emitter region EL, the p-type floating region FL, and an n-type hole barrier region TG. The GGEE type cell structure further includes the n-type drift layer DL located below the n-type hole barrier region HBL, an n-type field stop layer FSL located below the n-type drift layer DL, a p-type collector layer CL located below the n-type field stop layer FSL, and a collector electrode CE located below the p-type collector layer CL. The emitter electrode EE is electrically connected to the p-type base region BL and the n-type emitter region EL via a contact member in the contact hole CH1 formed in an interlayer insulating film IL. A body contact region BC is a high-concentration p-type base contact layer formed on the p-type base region BL. The emitter electrode EE is electrically connected to the trench emitter TE through a contact hole CH2 formed in the interlayer insulating film IL and the p-type base region BL formed between a pair of trench emitters TE. An insulating film FPF is formed above the emitter electrode EE. The insulating film FPF is a final passivation film made of, for example, an organic insulating film containing polyimide as a main component. When the p-type is a first conductivity type, the n-type can be referred to as the second conductivity type opposite to the first conductivity type.

In the p-type floating region FL, a crystal defect region CDR including crystal defects are selectively formed at a position near the first main surface US in the p-type floating region FL indicated by a dotted square line. When the depth of the p-type floating region FL is, for example, about 6 micromotors, the crystal defect region CDR is formed in a region of 0 to 2 micromotors in the depth direction from the first main surface US in the p-type floating region FL. The crystal defect region CDR has a high crystal defect density portion near the first main surface US. Here, the crystalline defect density in the crystal defect region CDR is, for example, $1 \times 10^3$ pieces/cm2 or less. A crystal defect density in a region in which the p-type floating region FL is depleted when a reverse bias is applied between the emitter electrode EE and the collector electrode CE and at a turned off state of the IGBT is approximately the same as the crystal defect density of the original semiconductor substrate SUB. Note that, the region in which the p-type floating region FL is depleted is located in a portion of the p-type floating region FL at a depth of 3 to 6 micromotors from the first main surface US.

The semiconductor device including IE type IGBT 100 incorporates a parasitic P-channel MOSFET in which the floating region FL is source region, the base region BL is drain region, and the trench emitter TE is a gate electrode. The hole barrier region HBL constitutes a channel forming region of the parasitic P-channel MOSFET. The collector electrode CE acts as a back gate of the parasitic P-channel MOSFET via the collector layer CL, the field stop layer FSL, the drift layer DL, and the hole barrier region HBL. The parasitic P-channel MOSFET allows holes accumulated in the floating region FL to be discharged to the emitter electrode EE in a short path during switching of IGBT, thereby reducing switching times. In addition, since the potential variation of the floating region FL is suppressed, the potential of the trench gate TG is stabilized, and switching loss at the time of switching can be suppressed.

Hereinafter, semiconductor device including IE type IGBT 100 will be described briefly.

First, the semiconductor substrate SUB is formed of monocrystalline silicon into which an n-type impurity such as phosphorus (P) is introduced, and an impurity concentration of the semiconductor substrate SUB is an impurity concentration of the drift layer DL as it is.

The hole barrier region HBL is formed by introducing n-type impurities from the first main surface US of the semiconductor substrate SUB. An ion species of the n-type impurity can be exemplified as suitable, for example, phosphorus. In addition, the hole barrier region HBL has a function as a barrier against holes by suppressing holes from reaching the base region BL and being discharged during the operation of the IE type IGBT. The impurity concentration of the hole barrier region HBL is set to be higher than the n-type impurity concentration in the drift layer DL and lower than the n-type impurity concentration of the emitter region EL described later.

The floating region FL is formed by introducing p-type impurities from the first main surface US of the semiconductor substrate SUB. As shown in FIG. 4, the floating region FL is formed by multistage ion-implantation method using a first ion-implantation step S1, a second ion-implantation step S2, and an annealing step S3 can be exemplified as a suitable manufacturing method. The ion-implantation of the first S1 and the second S2 steps is performed on the same region (desired region) of first main surface US of the semiconductor substrate SUB.

In the first ion-implantation step S1, for example, the ion species (the ion species of the first conductivity type) is boron (B), the dose amount is $6.0 \times 1012/cm2$ to $1.25 \times 1013/cm2$, the acceleration energy is 300 keV to 1.25 MeV.

In the second ion-implantation step S2, for example, the ion species is boron (B), the dose amount is $1.0 \times 1013/cm2$ to $2.75 \times 1013/cm2$, the acceleration energy is 300 keV to 1.25 MeV.

Then, the annealing step S3 is performed after the first ion-implantation step S1 and the second ion-implantation step S2. In the annealing step S3, for example, a heat treatment is performed to 900 degrees Celsius. for about 30 seconds. As a result, the ions implanted by the first ion-implantation step S1 and the second ion-implantation step S2 are activated by the heat treatment to form the floating region FL having the crystal defect region CDR including the crystal defects selectively formed at a position near the first main surface. In addition, since the annealing step S3 can be performed only once, it is possible to reduce the cost by reducing the annealing step.

When the depth of the floating region FL (a depth of ate lowest portion of the floating region FL) is insufficient, ion implanted impurity (boron) may be diffused by an additional heat treatment. Alternatively, a heat treatment step of diffusing ion implanted impurity (boron) may also serve as an annealing step S3.

The trench gate TG and the trench emitter TE are formed of an n-type impurity-doped polycrystalline silicon formed so as to be filled in trench formed by etching on the main surface of the semiconductor substrate SUB. The trench gate TG and the trench emitter TE are electrically isolated from semiconductor layer formed in the semiconductor substrate SUB by a gate insulating film GI. A thickness of the gate insulating film GI is, for example, 0.10 to 0.12 micrometers.

A depth of the trenches can be exemplified as suitable values, for example, 3.0 to 3.5 micrometers. And a width of the trenches can be exemplified as suitable values, for example, 0.5 to 1.0 micrometers. Further, the trenches are formed in a stripe shape in plan view, and each of the trench gate TG and the trench emitter TE is arranged so as to face each other with sandwiched the hole barrier region HBL. The floating region FL is arranged between the trench gate TG and the trench emitter TE. The depth of the floating region FL may be, for example, 5 to 6 micrometers as a preferable example, and a bottom surface portion of the floating region FL is formed so as to cover the bottom surface portion of the trench, and the electric field concentration in the bottom surface of the trench gate TG is relaxed.

The p-type base region BL is formed by introducing a p-type impurity from the first main surface US of the semiconductor substrate SUB. The p-type impurity is, for example, boron (B). Since the acceleration energy for the ion-implantation of the p-type base region BL is set low, ion-implantation damage is small and the crystal defects are less likely to remain.

The base region BL is formed on the hole barrier region HBL so as to be in contact with one side surface of the trench gate TG via the gate insulating film GI. The base region BL is formed on the hole barrier region HBL so as to be in contact with one side surface of the trench emitter TE via the gate insulating film GI.

An ion-implantation for forming the base region BL may be implemented not only on the hole barrier region HBL but also on the floating region FL. However, in this case, the floating region FL has only a high density, and the function as the floating region FL does not change. There is an advantage that a fine mask pattern is not required as compared with a in case of that is ion-implantation only on the hole barrier region HBL.

The n-type emitter region EL is formed by introducing an n-type impurity from the first main surface US of the semiconductor substrate SUB. The n-type impurity is, for example, arsenic (As).

The interlayer insulating film IL is formed on the first main surface US of the semiconductor substrate SUB so as to cover the emitter region EL, the base region BL, and the floating region FL. The interlayer insulating film IL is, for example, a silicon oxide film or a PSG (Phosphorus Silicate Glass) film formed by CVD method or the like. The thickness of the interlayer insulating film IL is, for example, about 0.6 micromotors. As the material of the interlayer insulating film IL other than silicon oxide or the PSG, it can be exemplified as suitable, for example, a BPSG (Boron Phosphorus Silicate Glass), a NSG (Non-doped Silicate Glass), a SOG (Spin On Glass), or composite thereof.

The contact holes CH1 and CH2 are formed in the interlayer insulating film IL. The contact holes CH1 and CH2 can be formed by, for example, anisotropic dry etching. By the anisotropic dry etching, the contact holes CH1 and CH2 are formed so as to etch portions of the main surface and reach to a middle portion of the base region BL and the trench emitter TE.

The body contact region BC is formed by introducing an p-type impurity into the first main surface US of the semiconductor substrate SUB thorough the contact holes CH1 and CH2. The p-type impurity is, for example, boron (B).

The emitter electrode EE is formed on the interlayer insulating film IL including insides of the contact holes CH1 and CH2. The emitter electrode EE can be formed of an aluminum film by sputtering method. Alternatively, the emitter electrode EE may be formed as a laminated film, for example, in the following manner. First, a titanium-tungsten film is formed as a barrier metal film on the first main surface US of the semiconductor substrate SUB by, for example, sputtering method. A thickness of the titanium-tungsten film is, for example, about 0.2 micrometers.

Next, after a silicide annealing is performed, an aluminum-based metal film is formed by, for example, sputtering method such that the aluminum-based metal film is formed on the entire surface of the titanium tungsten film and filled inside of the contact holes CH1 and CH2. the aluminum-based metal film is comprising, for example, an aluminum film to which several percent of silicon and/or copper is added, and has a thickness of about 5 micrometers.

Next, by performing into a predetermined pattern by dry etching method using a resist pattern as a mask, the emitter electrode EE made of a laminated film of a titanium-tungsten film and an aluminum-based metal film can be formed.

The emitter electrode EE is electrically connected to each of the emitter region EL, the body contact region BC, and the trench emitter TE.

Next, the final passivation film FPF is formed on the emitter electrode EE and the interlayer insulating film IL. The final passivation film FPF is, for example, an organic film mainly composed of polyimide. And a thickness of the final passivation film FPF is, for example, about 10 micrometers. The final passivation film FPF is formed by coating the organic film on the emitter electrode EE and the interlayer insulating film IL. And openings are formed as the emitter pad EP portion and a gate pad GP portion by using ordinal lithography technology.

After the final passivation film FPF is formed, the semiconductor substrate SUB is thinned by back grinding process against on a second main surface BS opposite to the first main surface US of the semiconductor substrate SUB. The back grinding process thinners a thickness of the semiconductor substrate SUB originally having 800 micrometers to, for example, 30 to 200 micrometers.

Next, an n-type field stop layer FSL is formed by selectively implanting an N-type impurity into the second main surface BS of the thinned substrate SUB by ion-implantation method. The n-type impurity is, for example, phosphine (P).

Next, the p-type collector layer CL is formed by implanting a P-type impurity into the second main surface BS of the thinned substrate SUB by ion-implantation method. The p-type impurity is, for example, boron (B). Note that the field stop layer FSL and the p-type collector layer CL may be formed by sequentially introducing an N-type impurity and a P-type impurity and performing laser annealing on the second main surface BS of the semiconductor substrate SUB.

Next, the collector electrode CE is formed on the collector layer CL by, for example, sputtering method. The collector electrode CE can be formed by laminated film such as an aluminum (Al) layer, a titanium (Ti) layer, a nickel (Ni) layer, and a gold (Au) layer in order from the second main surface BS of the semiconductor substrate SUB, for example. The collector electrode CE may be a metal film, such as a titanium nitride film, formed by sputtering method or CVD method.

IE type IGBT shown in FIG. 2 can be manufactured by the above manufacturing process. Here, in order to more specifically exemplify the device structure, an exemplary main dimension of each part of the device is shown.

A trench pitch spacing of the pair of trench gate TG is 1.8 to 2.0 micrometers, a trench pitch spacing of the pair of trench emitters TE is 0.9 to 1.1 micrometers, a width WFL of the floating region FL (see FIG. 6) is 5.5 to 7 micrometers, and depth of the floating region FL is 4.5 to 6 micrometers.

FIG. 3 is a diagram for explaining a cell region RR, and is a main portion plan view of the cell region RR of FIG. 1. FIG. 2 is a schematic cross-sectional view along B-B line of FIG. 3.

A cell region RR includes an active cell region RCa, a non-active region Ria, and a hole collector cell region RCc. Each of the active cell region RCa, the inactive region Ria, and the hole collector cell region RCc is provided so as to extend in a stripe-like manner along a first direction Y. Four of the active cell region RCa, the inactive region Ria, the hole collector cell region RCc, and other inactive region Ria are arranged repeatedly in the second direction X perpendicular to the first direction Y in this order.

An active cell Ca is formed in the active cell region RCa. In FIG. 3, as the active cell Ca, a pair of trench gates TG formed in a stripe-like shape extended in the first direction Y and the emitter region EL provided between the pair of trench gates TG are illustrated. A hole collector cell Cc is formed in the hole collector cell region RCc. As illustrated in FIG. 2, the hole collector cell Cc is the parasitic P-channel MOSFET having a floating region FL as source region, the base region BL as drain region, an hole barrier region HBL as a channel forming region, and the trench emitter TE as a gate electrode. In FIG. 3, as the hole collector cell Cc, the pair of trench emitters TE formed in a stripe-like shape extended in the first direction Y and a connection trench emitter TEa connecting the pair of trench emitters TE are illustrated. In the non-active region Ria, the floating region FL is illustrated in FIG. 3. When the contact hole CH2 is formed so as to be in contact with both of the pair of trench emitters TE as shown in FIG. 2, the connection trench emitter TEa may not be required. When the contact hole CH2 is formed so as to be in contact with only one of the pair of trench emitters TE, it is preferable to provide the connection trench emitter TEa. Here, the trench gate TG and the trench emitter TE can be regarded as extending in the first direction Y in a plan view and adjacent each other in the second direction X perpendicular (or intersecting) to the first direction Y in a plan view.

Configuration Example 2 of the GE Type Structure

Figure 5:
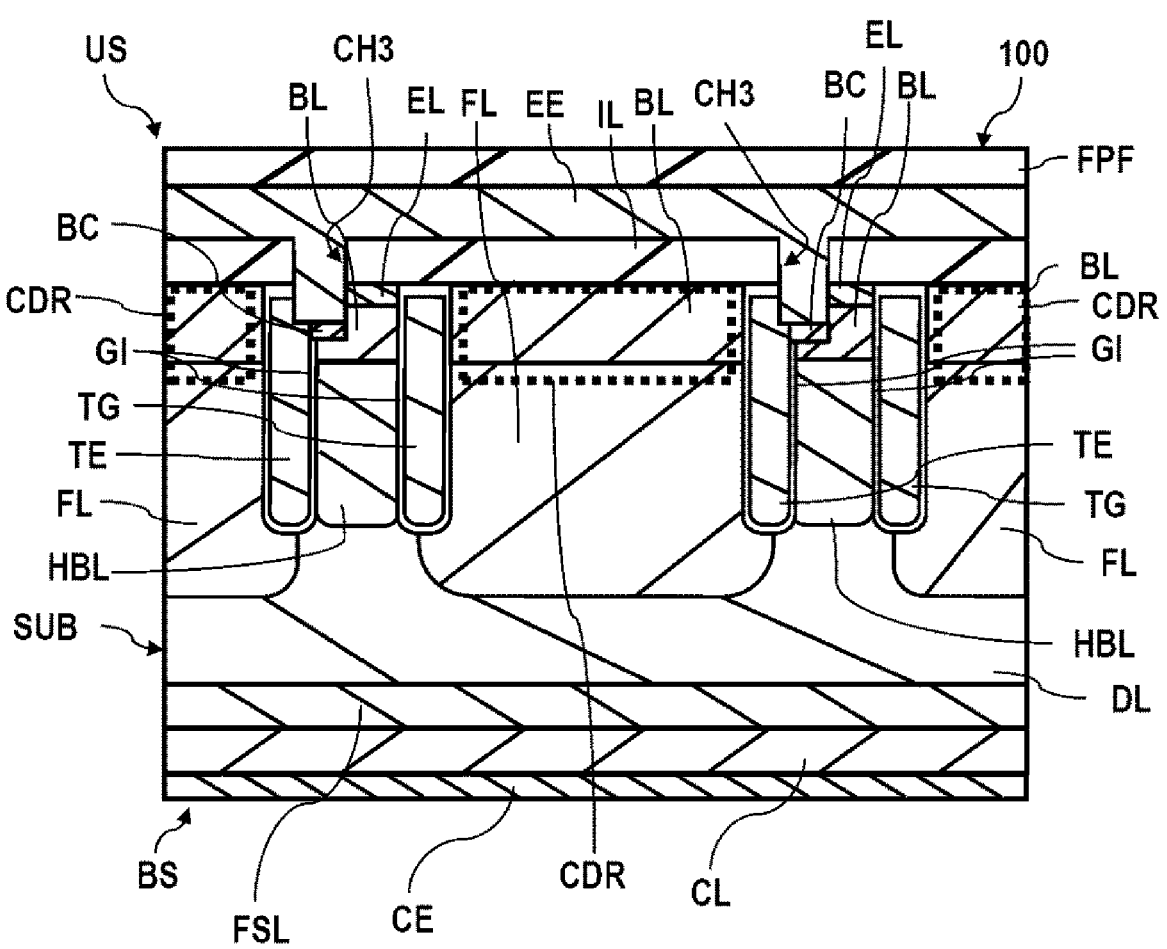
FIG. 5 is a main portion cross-sectional view of according to another configuration example of the cell region RR shown in FIG. 1.

FIG. 5 is a main portion cross-sectional view according to another configuration example of the cell region RR shown in FIG. 1. In FIG. 2, it shows the cell structure of the GGEE type structure, but in FIG. 5, it shows a cross-sectional view illustrating a cell structure of the GE type structure.

A different point of the cell structure of the GE type structure in FIG. 5 from the cell structure of the GGEE type structure in FIG. 2 is that a pair of the trench emitter TE and the trench gate TG are paired, and a plurality of pairs of the trench emitter TE and the trench gate TG are formed. In an area between the plurality of pairs of the trench emitter TE and the trench gate TG, the emitter electrode EE is electrically connected via a contact hole CH3 formed in the interlayer insulating film IL to each of the emitter region EL, the body contact region BC, and the trench emitter TE. The other configuration of the cell structure of the GE type structure of FIG. 5 is the same as the other configuration of the cell structure of the GGEE type structure of FIG. 2, and redundant explanation will be omitted. The floating region FL and the crystal defect region CDR in FIGS. 2 and 5 are formed of the same manufacturing method and have the same configuration.

Configuration Example 3 of the GG Type Structure

Figure 22:
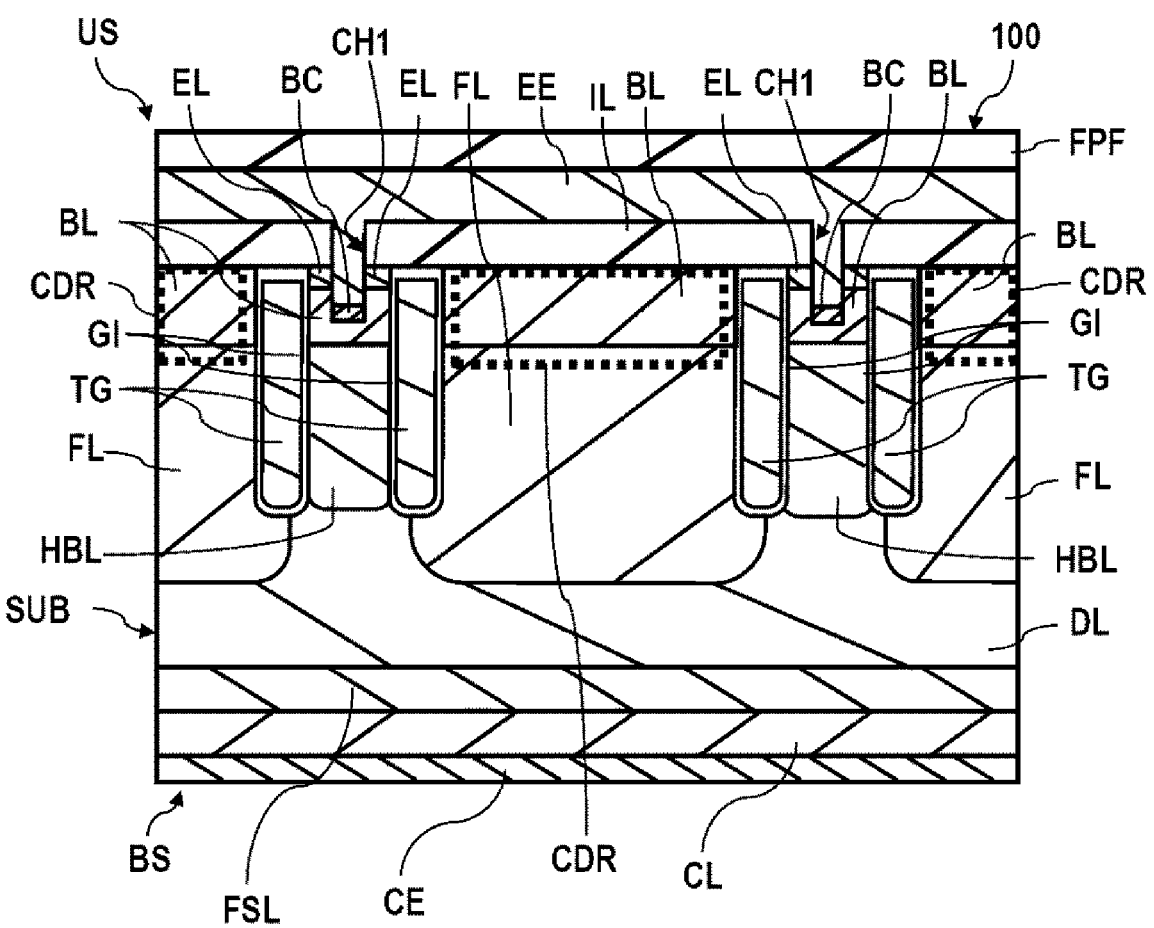
FIG. 22 is a main portion cross-sectional view according to another exemplary configuration of the cell region RR shown in FIG. 1.

FIG. 22 is a main portion cross-sectional view according to another configuration example of the cell region RR shown in FIG. 1. That is, FIG. 22 is a cross-sectional view illustrating a cell structure of the GG type structure. A different point of the cell structure of the GG type structure in FIG. 22 from the cell structure of the GGEE type structure in FIG. 2 is that a portion of the pair of trench emitters TE of the cell structure of the GGEE type structure in FIG. 2 is replaced by the same structure of the pair of trench gates TG with provided the base region BL, the emitter region EL, the body contact region BC, and the contact hole CH1. The other configuration of the cell structure of the GG type structure of FIG. 22 is the same as the other configuration of the cell structure of the GGEE type structure of FIG. 2, and redundant explanation will be omitted. The floating regions FL and the crystal defect region CDR of FIGS. 2, 5, and 22 are formed of the same manufacturing method and have the same configuration.

Configuration Example of the Crystal Defect Region

Figure 6:
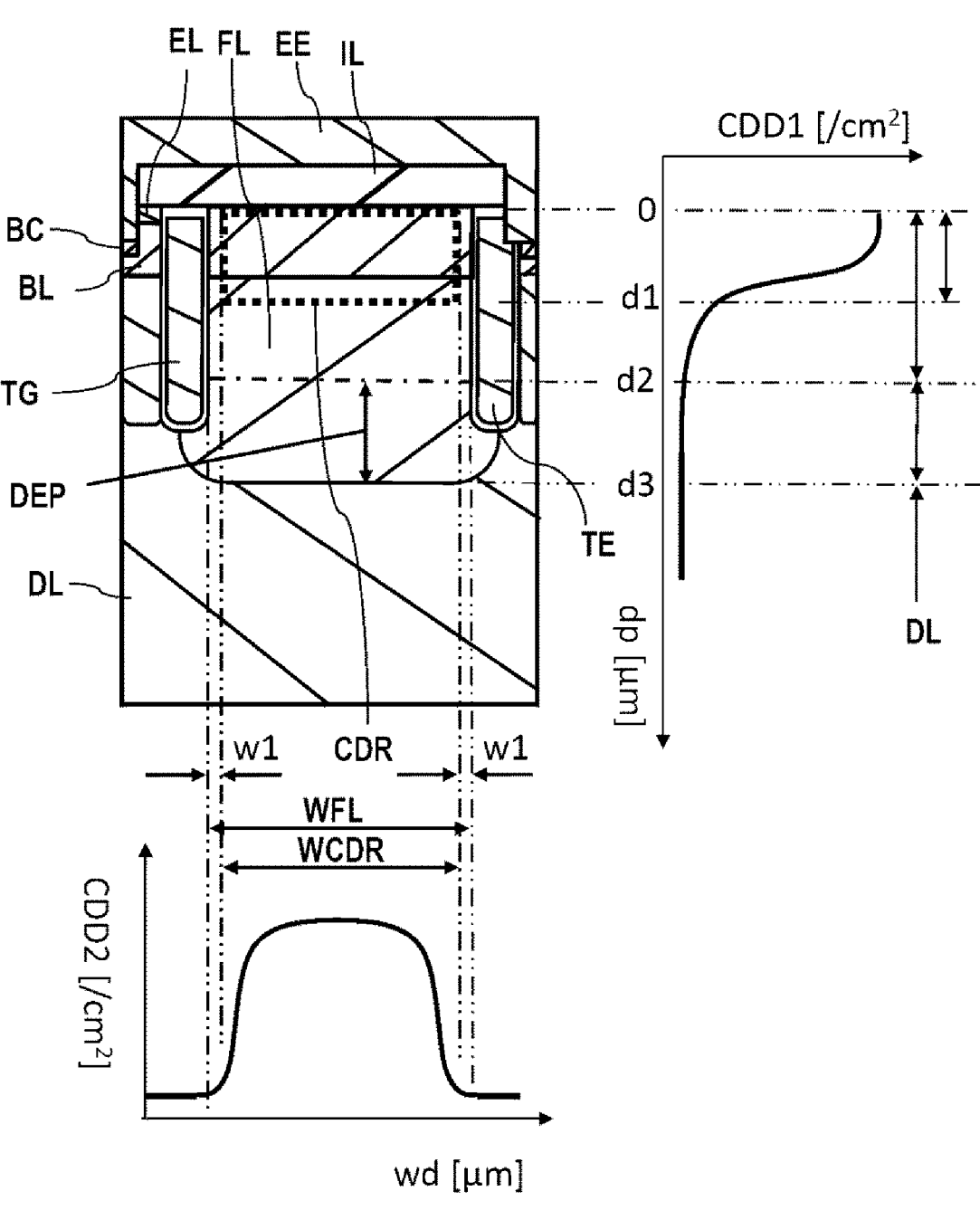
FIG. 6 is a diagram for explaining a configuration of a crystal defect region of FIGS. 2 and 5.

FIG. 6 is a diagram for explaining the configuration of the crystal defect region CDR of FIGS. 2 and 5. In FIG. 6, there are a cross-sectional view between the trench gate TG and the trench emitter TE in the cell structure of the GGEE type structure of FIG. 2 or the cell structure of GE type structure of FIG. 5, and a graph of the crystal defect density in a depth direction and a lateral direction of the crystal defect region CDR formed in the floating region FL. Here, the depth of the floating region FL is, for example, about 6 micrometers. The crystal defect region CDR in which the crystal defects are selectively formed is provided in a region having a depth of 0 to 2 micrometers from the surface of the floating region FL.

In the explanation of the depth direction (dp) of the crystal defect region CDR in FIG. 6, for example, it is assumed that the depth 0 indicates the upper end portion of the floating region FL or the upper end portion of the crystal defect region CDR, the depth d1 indicates the lower end portion of the crystal defect region CDR, the depth d2 indicates the upper end (or the upper portion) of a depletion layer DEP in the off-state (at the time of the rated voltage, or more preferably at the time of avalanche state), and the depth d3 indicates the lower end portion of the floating region FL. Below the depth d3 is the region of the drift layer DL.

The depletion layer DEP is extended as the applied voltage of the collectors is higher, but even if it is not in the avalanche state, it is no problem in terms of leakage unless the crystal defect region CDR does enter the depletion layer DEP when the voltage is applied up to the rated voltage.

The bottom of the floating region FL is located below the bottom of the trench gate TG and the trench emitter TE. The floating region FL has the crystal defect region CDR near the upper end portion of the floating region FL. That is, the crystal defect region CDR is located between the upper end portion of the floating region FL that is depth 0 and the upper end of the depletion layer DEP that is depth d2. In other word, the crystal defect region CDR is formed in a region between the upper end portion of the floating region FL and the upper end of the depletion layer DEP where the depletion layer DEP is not formed. By configuring the crystal defect region CDR to exist in a region not included in the depletion layer DEP even when the device is turned off, it is possible to suppress deterioration of electrical characteristics such as an increase in leakage current when the device is turned off.

The crystal defect density CDD1 in the depth direction (dp) of the crystal defect region CDR has the following characteristics.

(1) The crystal defect density is relatively high in the upper portion of the floating region FL, for example, within a range of the depth of 0 to 2 micrometers from the upper end portion of the floating region FL. That is, it has a maximum crystal defect density within a range of the depth of 0 to 2 micrometers. And the crystal defect density is gradually reduced in a region of the floating region FL deeper than the depth d1 that is 2 micrometers.

(2) A crystal defect density within a depth range of 0 to 2 micrometers from the upper end portion of the floating region FL is, for example, 103/cm2 or less.

(3) In the floating region FL, a region having a depth that becomes the depletion layer DEP when a gate voltage is applied when a IGBT is turned off (or in the avalanche state), for example, a region having a depth from 2 to 6 micrometers that is from d2 to d3. And this region has a relatively low defect density similar to a defect density of the original semiconductor substrate SUB.

A crystal defect density CDD2 in the lateral direction (wd) of the crystal defect region CDR is has the following characteristics.

(4) The crystal defects are formed only inside the floating region FL. That is the lateral width of the crystal defect region CDR is included within the width WFL of the floating region FL.

(5) The crystal defect region CDR is formed so as not to contact the trenches (TE, TG) or penetrate the gate insulating film GI. That is, the crystal defects are not located on the side surface of the trenches (TE, TG) or in the gate insulating film GI. With this configuration, it is possible to suppress deterioration in electric properties such as deterioration in reliability of the gate insulating film GI. As a number of crystal defects increases, a possibility of the crystal defects penetrating the gate insulating film GI increases. Therefore, it is preferable to suppress the crystal defect density to 103/cm2 or less.

(6) The crystal defect region CDR is spaced apart from each other without being in contact with the trench gate TG and the trench emitter TE. The distance w1 between the trench (TE, TG) and the crystal defect region CDR is, for example, 0.1 to 0.3 micrometers, and more preferably, it is about 0.2 micrometers.

(Explanation of the Improvement of Switching Characteristics: Effect of the Crystal Defect Region CDR)

Figure 7:
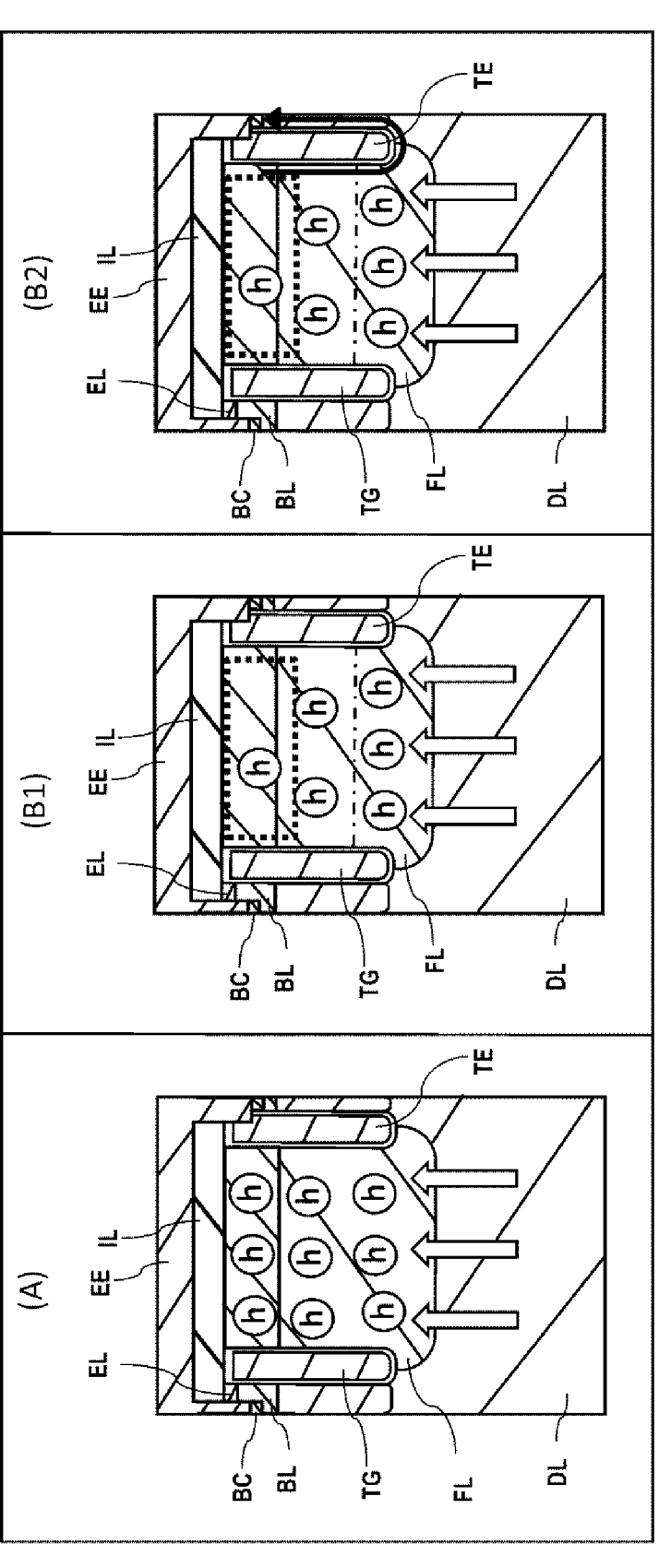
FIG. 7 is a diagram for explaining switching characteristics.

FIG. 7 is a diagram for explaining the switching characteristics. FIG. 7(A) shows a state of holes (holes h) at the start of gate bias application to the gate electrode GE of the IGBT from the OFF state when the crystal defect region CDR is not formed. As the gate bias is applied, the potential in the floating region FL rises and the holes (h) are induced. However, since a high voltage is applied to the collector, the parasitic P-channel MOSFET having the floating region FL as the source region, the base region BL as the drain region, and the trench emitter TE as the gate electrode GE is turned off due to the substrate bias effect, the induced the holes (h) is not released and accumulate in the floating region FL.

FIG. 7(B1) shows state of the holes (h) at the start of gate bias application to the gate electrode GE of the IGBT when the crystal defect region CDR is formed. And a part of the accumulated the holes (h) is trapped in the crystal defects (recombination centers).

FIG. 7(B2) shows the state of the holes (h) after the IGBT starts to turn-off and the collector voltage decrease when the crystal defect region CDR is formed. The parasitic P-channel MOSFET having the floating region FL as the source region, the base region BL as the drain region, and the trench emitter TE as the gate electrode GE starts to operate, and the hole h starts to be discharged.

In other words, immediately after the gate-bias is applied (before the IGBT starts to turn-off and the collector voltage decrease), the holes (h) cannot be discharged by the parasitic P-channel MOSFET, and the hole h accumulates in the floating region FL. The crystal defects in the crystal defect region CDR are used as a field for recombining the holes (h). Subsequently, the bias applied to NW (hole barrier region HBL) gradually weakens, and the parasitic P-channel MOSFET starts to operate. Therefore, the hole h is discharged from the vicinity of the trench emitter TE to the emitter electrode EE.

In a cell structure of the GG type structure of FIG. 22, since the parasitic P-channel MOSFET is not provided, the holes (h) cannot be positively discharged to the emitter electrode EE, and it is necessary to wait for the holes (h) to be emitted by diffusion. However, since the crystal defects in the crystal defect region CDR are also provided in the present structure, the effect of the accumulation of the holes (h) can be reduced. Note that, the GG type structure shown in FIG. 22 has a lower switching speed than the GGEE type structure shown in FIG. 21, however, since the holes (h) do not escape from the pair of the trench emitter TE, it is possible to efficiently accumulate the holes (h) in the drift layer, there is an advantage that VCE(sat) can be reduced. In addition, since the trench gate TG is dense, it is possible to increase a saturated current in the on-state.

The ease with which the holes (h) accumulated in the floating region FL between the trench gate TG and the trench emitter TE are discharged affects the switching time of the IGBT.

In order to further enhance the switching characteristic, it is necessary to suppress the hole accumulation effect in the floating region FL. As a solution for this issue, the crystal defects in the crystal defect region CDR are used to suppress the hole accumulation. As a result, the ease of discharging the holes (h) accumulated in the floating region FL can be improved. Consequently, the switching speed of IGBT can be increased by improving the turn-on property.

On the other hand, in the on-state, holes are accumulated in the drift layer, however if there are more recombination centers in the floating region FL than required, the holes to be accumulated in the drift layer diffuse into the floating region FL according to the concentration gradient, and recombine at the recombination center, so that the hole accumulation effect in the drift layer is reduced, and it leads to degradation of electrical properties, such as increased VCE(sat). From this point of view as well, it is preferable to suppress the crystal defect density to 103/cm2 or less.

(Explanation of Evaluation Results of the Crystal Defects)

FIG. 8 is a diagram for explaining an evaluation result of the crystal defects according to the embodiment. Specifically, FIG. 8 shows evaluation results of the crystal defects in the depth direction of the floating region FL. The floating region FL are formed by manufacturing method described with reference to FIG. 4. Here, the evaluation method of the crystal defects used the "Japanese Industrial Standard (JIS H 0609)". In the JIS H 0609, an JIS-G solution is used as an etchant. JIS-G solution consists of 126 ml of water, 254 ml of 70% nitric acid, and 20 ml of 50% hydrofluoric acid. An etching rate of Si with the JIS-G solution is about 1 micrometer/min.

In a crystal defect evaluation result Evr shown in FIG. 8, the floating region FL is etched using a JIS-G solution to evaluate crystal defects.

An approximate etch amount (etching depth: depth ds from the first main surface of the semiconductor substrate SUB) is calculated from the etching rate of Si by the JIS-G solution and the cumulative etching time Tte. In the crystal defect evaluation result Evr, if there is a crystal defect, it is observed as a diagonal black streak. The observed black streaks are the sum of the crystal defect existing from the surface to the etching depth, so by repeating the etching and observation, the depth of the crystal defect can be estimated.

In the example of the evaluation result Evr illustrated in FIG. 8, there are three cumulative etching times Tte: 1 min (depth ds from the first main surface of the semiconductor substrate SUB: about 1 micrometer), 2 min (depth ds from the first main surface of the semiconductor substrate SUB: about 2 micrometers), and 3 min (depth ds from the first main surface of the semiconductor substrate SUB: about 3 micrometers).

(1) The evaluation result Evr when the cumulative etching time Tte is 1 minute indicates that a slight crystal defect is formed in a depth of about 1 micrometer from the first main surface of the semiconductor substrate SUB.

(2) The evaluation result Evr when the cumulative etching time Tte is 2 minutes indicates that new crystal defect is formed between 1 to 2 micrometers from the first main surface of the semiconductor substrate SUB.

(3) The evaluation result Evr when the cumulative etching time Tte is 3 minutes indicates that no new crystal defect is formed between 2 to 3 micrometers from the first main surface of the semiconductor substrate SUB.

Since no new crystal defect formation was observed when the cumulative etching time is more than 3 minutes, it suggests that the crystal defect can be selectively formed only in the shallow region of the floating region FL. And it is confirmed that the crystal defect density CCD1 is 1×102/ cm2 to 1×103/cm2 by calculation based on the evaluation results with a cumulative etching time of 1 min.

That is, in the floating region FL formed by the manufacturing method described with reference to FIG. 4, crystal defects (crystal defect region CDR) can be selectively formed in a shallow region (0 to 2 micrometers from the first main surface of the semiconductor substrate SUB) of the floating region FL. As a result, the above-described effect can be obtained.

(Manufacturing Method of a Semiconductor Device Including IE Type IGBT)

Next, referring to FIGS. 9 to 21, a method of manufacturing a semiconductor device including an IE type IGBT will be described. Here, as an example, a method for manufacturing an IE-type IGBT having the cell structure of the GGEE type structure described with reference to FIG. 2 will be described.

Figure 9:
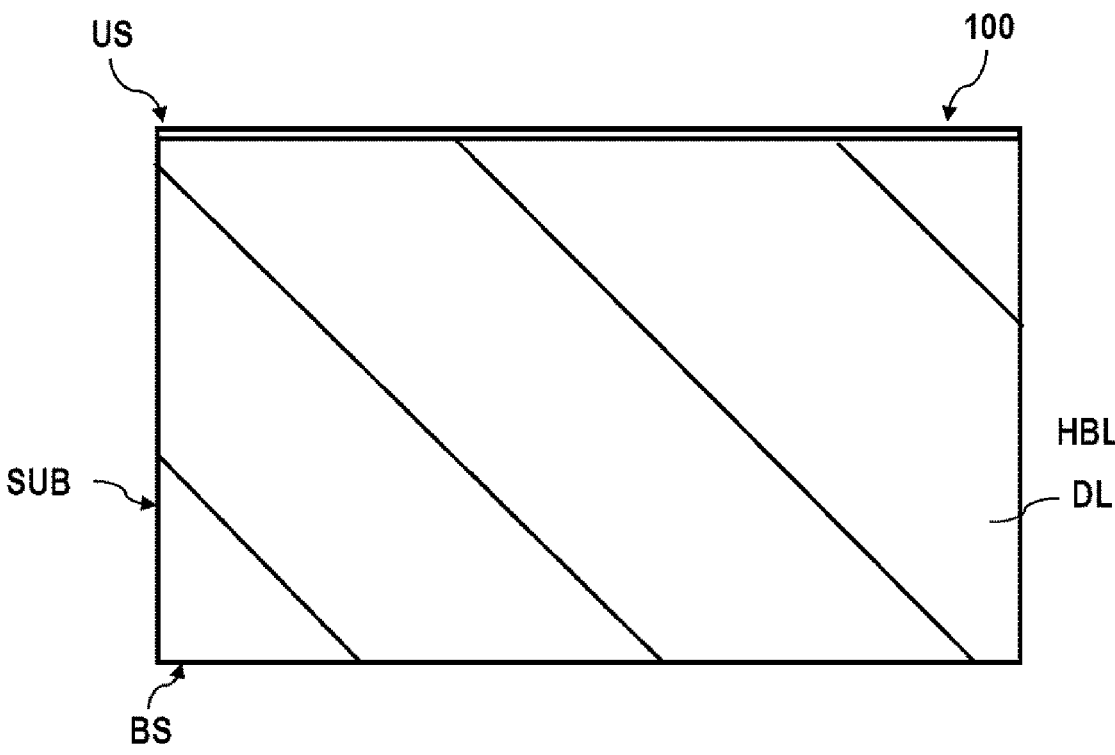
FIG. 9 is a cross-sectional view showing a step of a manufacturing method of a semiconductor device in the embodiment.

As shown in FIG. 9, the n-type drift layer DL is formed in a semiconductor substrate SUB. The n-type drift layer DL is formed by preparing the semiconductor substrate SUB into which an n-type impurity is introduced in advance, and using the n-type semiconductor substrate SUB as the n-type drift layer DL. Or a p-type semiconductor substrate SUB is prepared and formed the n-type drift layer DL on the p-type semiconductor substrate SUB by epitaxial method. In present embodiment, the drift layer DL may be described as the semiconductor substrate SUB.

Figure 10:
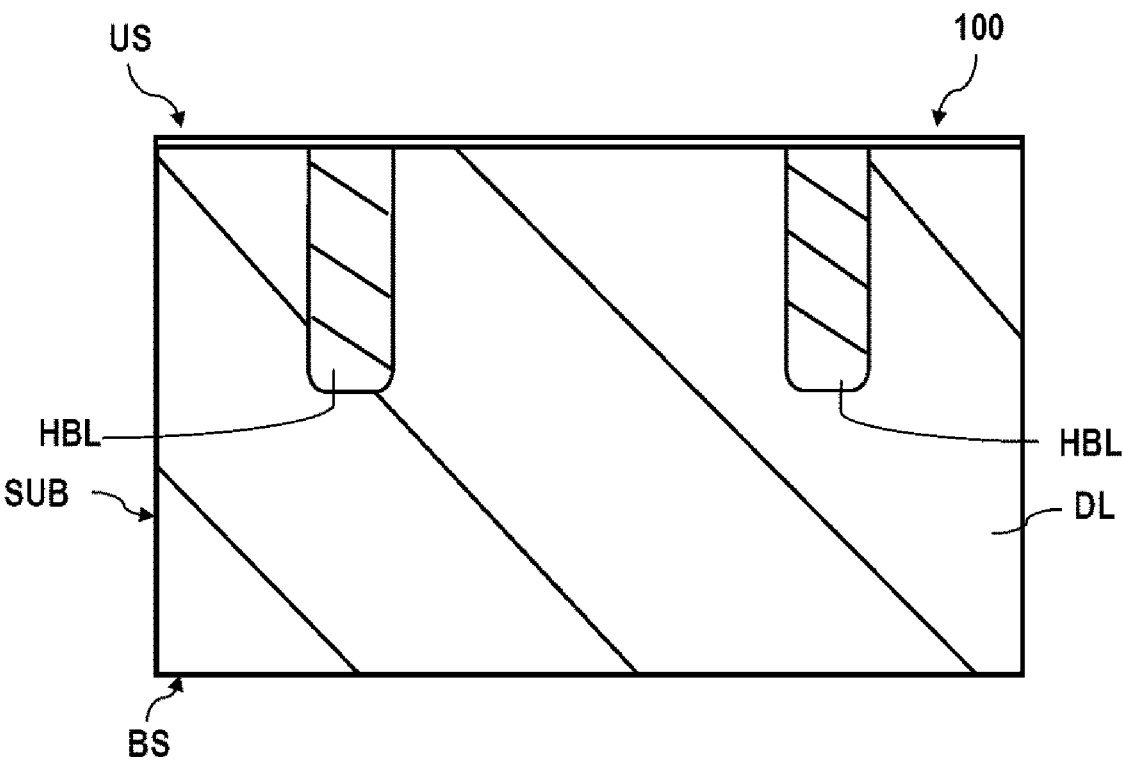
FIG. 10 is a cross-sectional view showing a step performed after the step shown in FIG. 9 in the embodiment.

Next, as shown in FIG. 10, an n-type hole barrier region HBL is formed on the drift layer DL by photolithography method and ion-implantation method. The n-type hole barrier region HBL has a higher impurity concentration than the drift layer DL. The impurity for forming the n-type hole barrier region HBL is, for example, phosphorus (P). The ion-implantation may be performed in a plurality of times.

Figure 11:
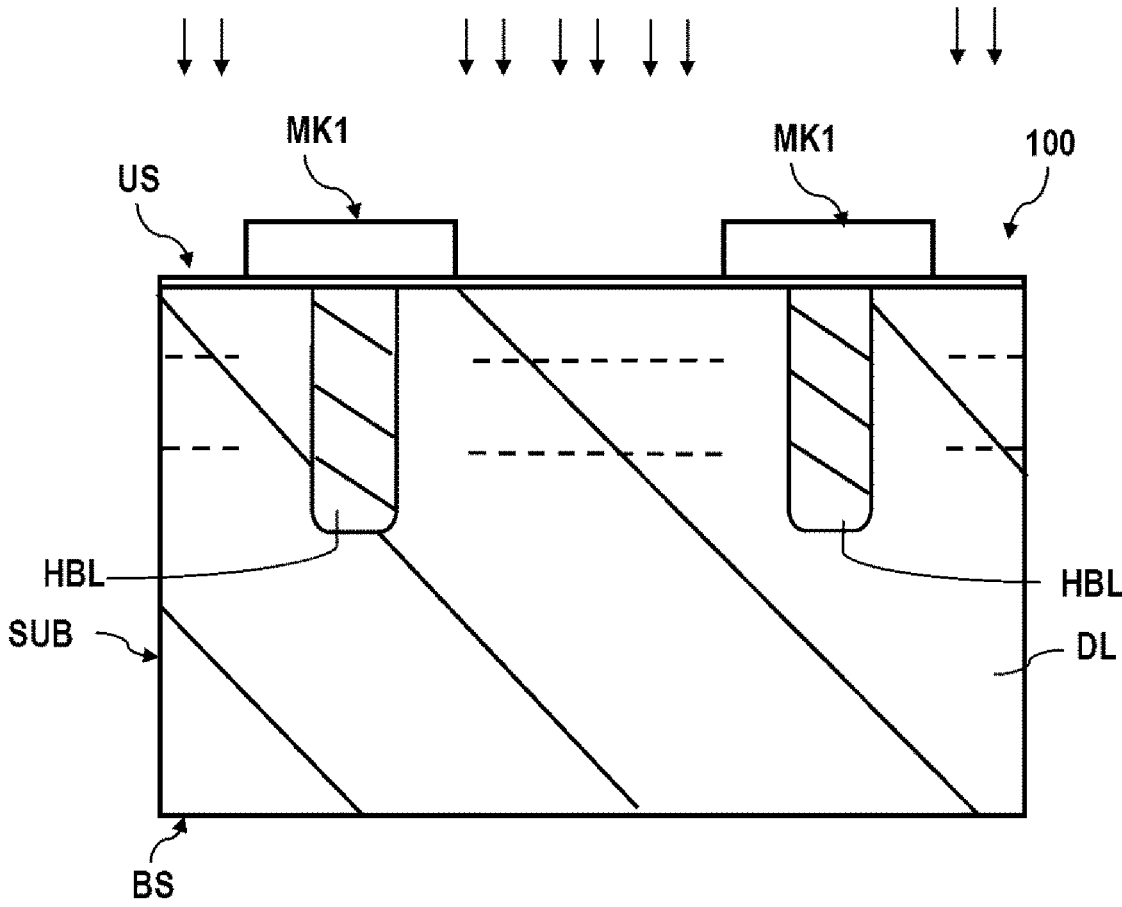
FIG. 11 is a cross-sectional view showing a step performed after the step shown in FIG. 10 in the embodiment.

Next, as shown in FIG. 11, boron (B) ions for forming a p-type floating region FL are implanted into the drift layer DL using photolithography method and ion-implantation method. A mask MK1 is selectively formed in a desired region of the first main surface US of the semiconductor substrate SUB. The mask MK1 is selectively formed on the first main surface US of the semiconductor substrate SUB so as to cover the region of the hole barrier region HBL and both sides thereof, and to allow ion-implantation to be performed in the region of the p-type floating region FL. Ion-implantation for forming the p-type floating region FL uses the first ion-implantation step S1 and the second ion-implantation step S2 described with reference to FIG. 4 to introduce boron (B) into the drift layer DL from the first main surface US of the semiconductor substrate SUB in two steps. Here, the first ion-implantation step S1 is performed, for example, the ion species is boron (B), the dose amount is $6.0 \times 10^{12}/cm^2$ to $1.25 \times 10^{13}/cm^2$, the acceleration energy is 300 keV to 1.25 MeV. The second ion-implantation step S2 is performed, for example, the ion species is boron (B), the dose amount is $1.0 \times 10^{13}/cm^2$ to $2.75 \times 10^{13}/cm^2$, the acceleration energy is a 300 keV to 1.25 MeV.

Figure 12:
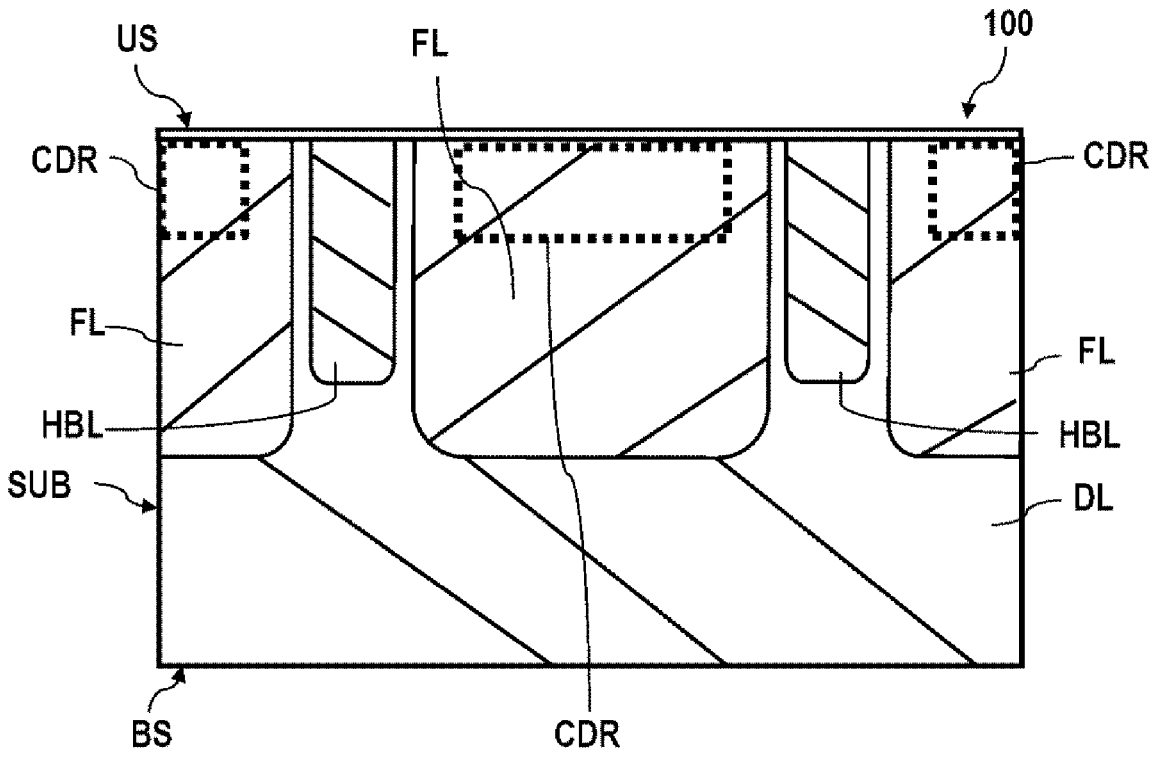
FIG. 12 is a cross-sectional view showing a step performed after the step shown in FIG. 11 in the embodiment.

Next, as shown in FIG. 12, the annealing step described in FIG. 4 is performed to form a p-type floating region FL. Here, a crystal defect region CDR is formed on the first main surface US of the p-type floating region FL.

Note that when the depth of the p-type floating region FL (a depth of ate lowest portion of the p-type floating region FL) is insufficient, ion implanted impurity (boron) may be diffused by an additional heat treatment. Or, in this step, the annealing may not be performed, and alternatively, a heat treatment for diffusing boron may serve as the annealing.

Figure 13:
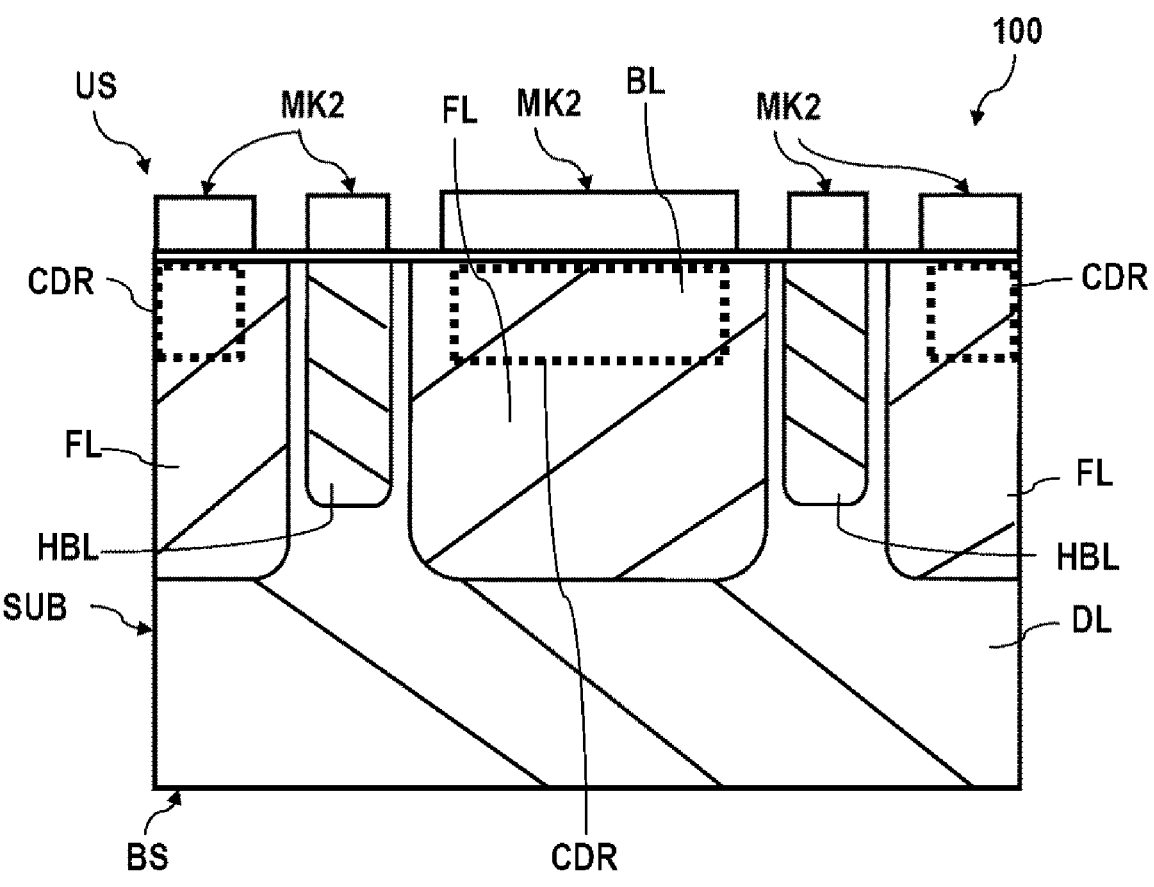
FIG. 13 is a cross-sectional view showing a step performed after the step shown in FIG. 12 in the embodiment.

Next, as shown in FIG. 13, an insulating film such as silicon oxide film is formed on the semiconductor substrate SUB by, for example, CVD (Chemical Vapor Deposition), and the insulating film is patterned by photolithography and dry etching to form a mask MK2. Since the mask MK2 is used as a mask for forming a first trench T1 (for trench gate TG) and a second trench T2 (for emitter trench TE) in the semiconductor substrate SUB, it is selectively formed on the surface of the semiconductor substrate SUB so that the forming regions of the first trench T1 and the second trench T2 on the surface of the semiconductor substrate SUB are exposed.

Figure 14:
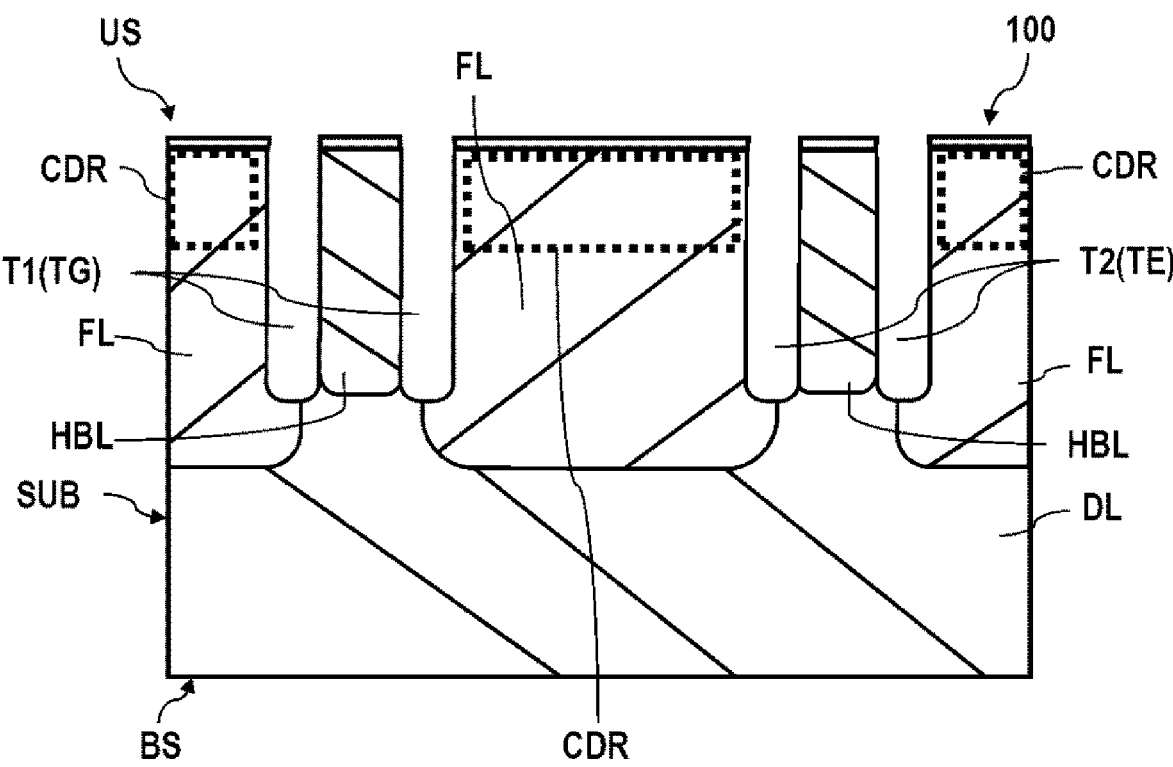
FIG. 14 is a cross-sectional view showing a step performed after the step shown in FIG. 13 in the embodiment.

Next, as shown in FIG. 14, a trench forming process is performed.

By etching the semiconductor substrate SUB using the patterned mask MK2 as a hard mask, the first trench T1 and the second trench T2 are formed in the semiconductor substrate SUB. Thereafter, the mask MK2 is removed by a wet etching process or the like.

Here, if desired, a heat treatment may be performed to diffuse boron (B) to set to a desired depth of the p-type floating region FL (a depth of ate lowest portion of the p-type floating region FL). By diffusing after the trench forming process, even if an area between the pair of trenches is narrow and it may be difficult to form the p-type floating region FL in the area, this diffusion process can be used.

Note that the heat treatment for diffusing boron does not necessarily follow this process flow, and the above advantages can be obtained if the heat treatment is performed after the trench formation process. For example, the heat treatment may be performed after forming a conductive film FG inside the first trench T1 and the second trench T2, or may be performed separately for both steps. By doing so, if there are other heat treatment steps such as sacrificial oxidation for removing damage in the trench formation step or heat treatment for incorporating a gate protection diode, which is not specifically described in this specification, the number of steps can be reduced because they can be combined.

Figure 15:
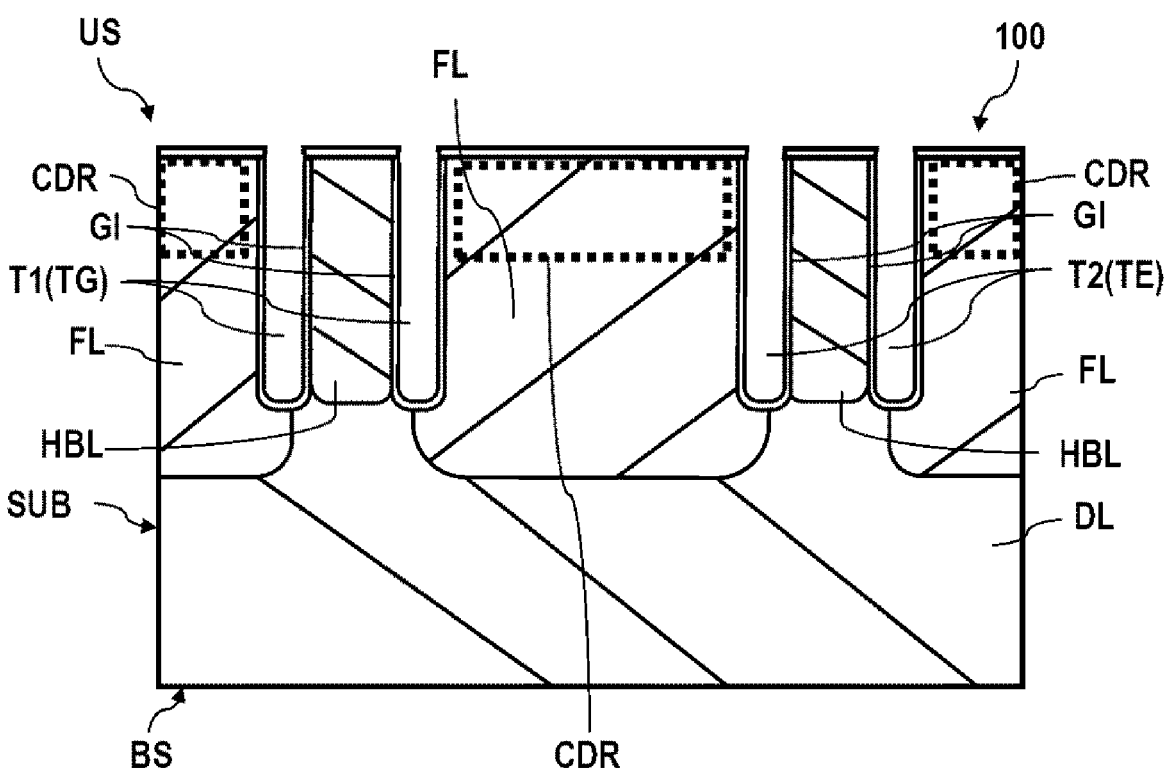
FIG. 15 is a cross-sectional view showing a step performed after the step shown in FIG. 14 in the embodiment.

Next, as shown in FIG. 15, the semiconductor substrate SUB is thermally oxidized to form an insulating film made of, for example, silicon oxide film on an inner wall of the first trench T1, an inner wall of the second trench T2, an upper surface of the floating region FL and an upper surface of the hole barrier region HBL. The insulating film formed on the inner wall of the first trench T1 and the inner wall of the second trench T2 becomes gate insulating film GI. The thickness of the gate insulating film GI is, for example, 100 nm.

Figure 16:
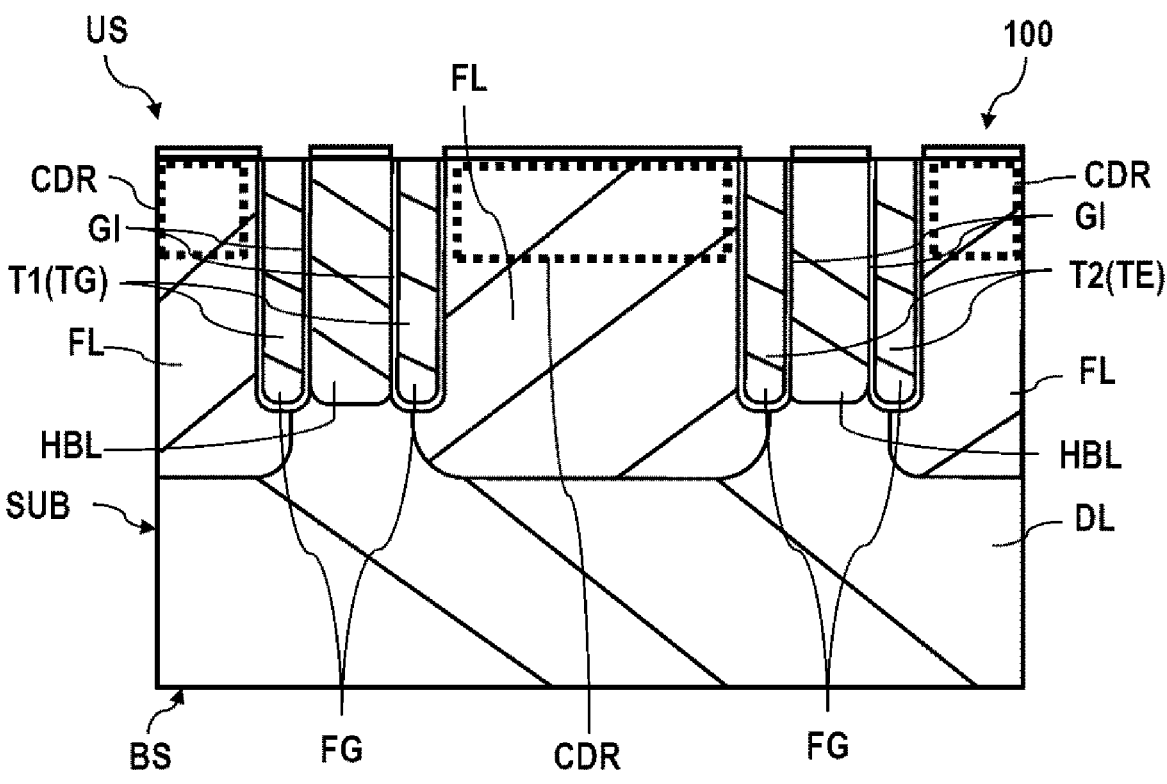
FIG. 16 is a cross-sectional view showing a step performed after the step shown in FIG. 15 in the embodiment.

Next, as shown in FIG. 16, the conductive film FG made of, for example, an n-type doped polysilicon film is formed by, for example, CVD method so as to fill in the inside of the first trench T1 and the inside of the second trench T2. The conductive film FG inside the first trench T1 becomes a gate electrode GE (also referred to as a first electrode) of the trench gate TG. The conductive film FG inside the second trench T2 becomes an emitter electrode EE (also referred to as a second electrode) of the trench emitter TE.

Figure 17:
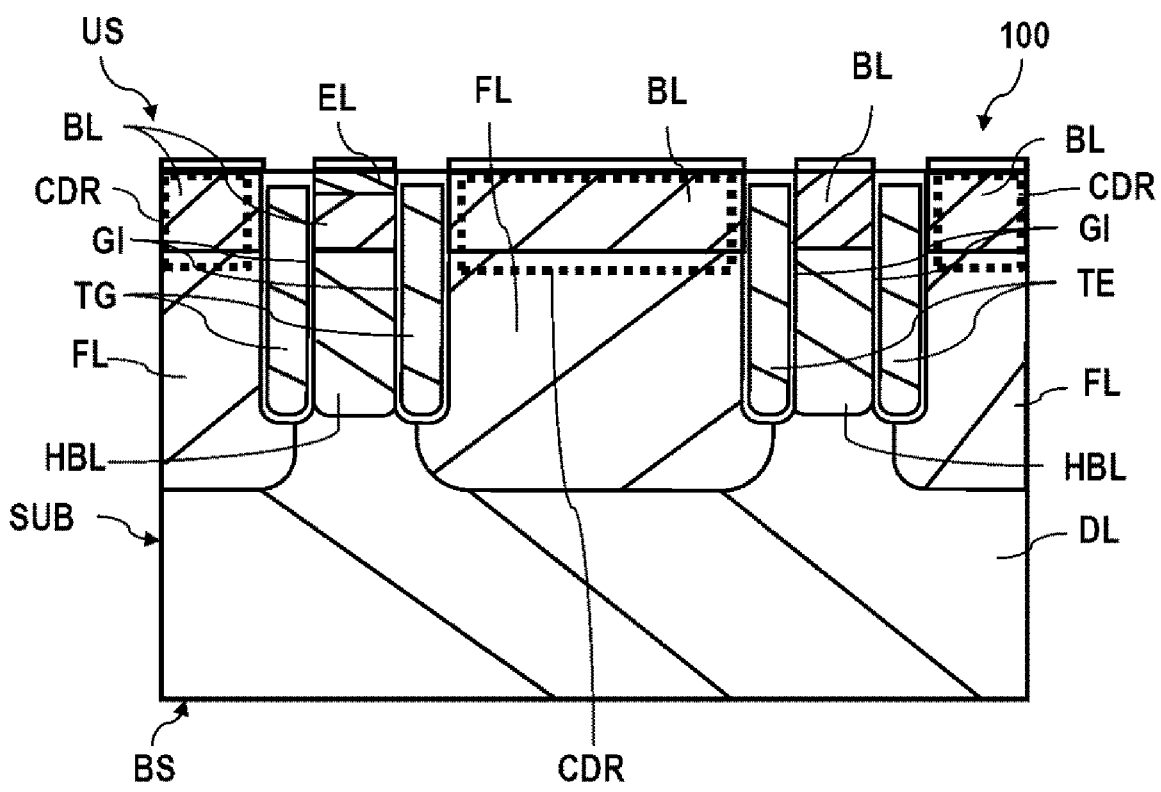
FIG. 17 is a cross-sectional view showing a step performed after the step shown in FIG. 16 in the embodiment.

Next, as shown in FIG. 17, a step of forming a base region (also referred to as a channel region) BL and an emitter region (also referred to as a souse region) EL is performed. First, a step of forming the base region BL is performed. Gate insulating film GI exposed on the surface of the semiconductor substrate SUB is removed or thinned by, for example, dry etching method or wet etching method, and then photolithography method and ion-implantation method are used to form the base region BL on the surface of each of the floating region FL and the hole barrier region HBL. The base region BL is an impurity region having an impurity concentration higher than that of the floating region FL. Impurities for forming the base region BL, for example, boron (B).

Next, a step of forming the emitter region EL is performed. By using photolithography method and ion-implantation method, the emitter region EL is formed on the base region BL of the active cell region. The emitter region EL is an impurity region having an impurity concentration higher than that of the hole barrier region HBL. At this time, the emitter region EL is not formed in the base region BL of the hole collector cell region. The impurity for forming the emitter region EL is, for example, arsenic (As).

Figure 18:
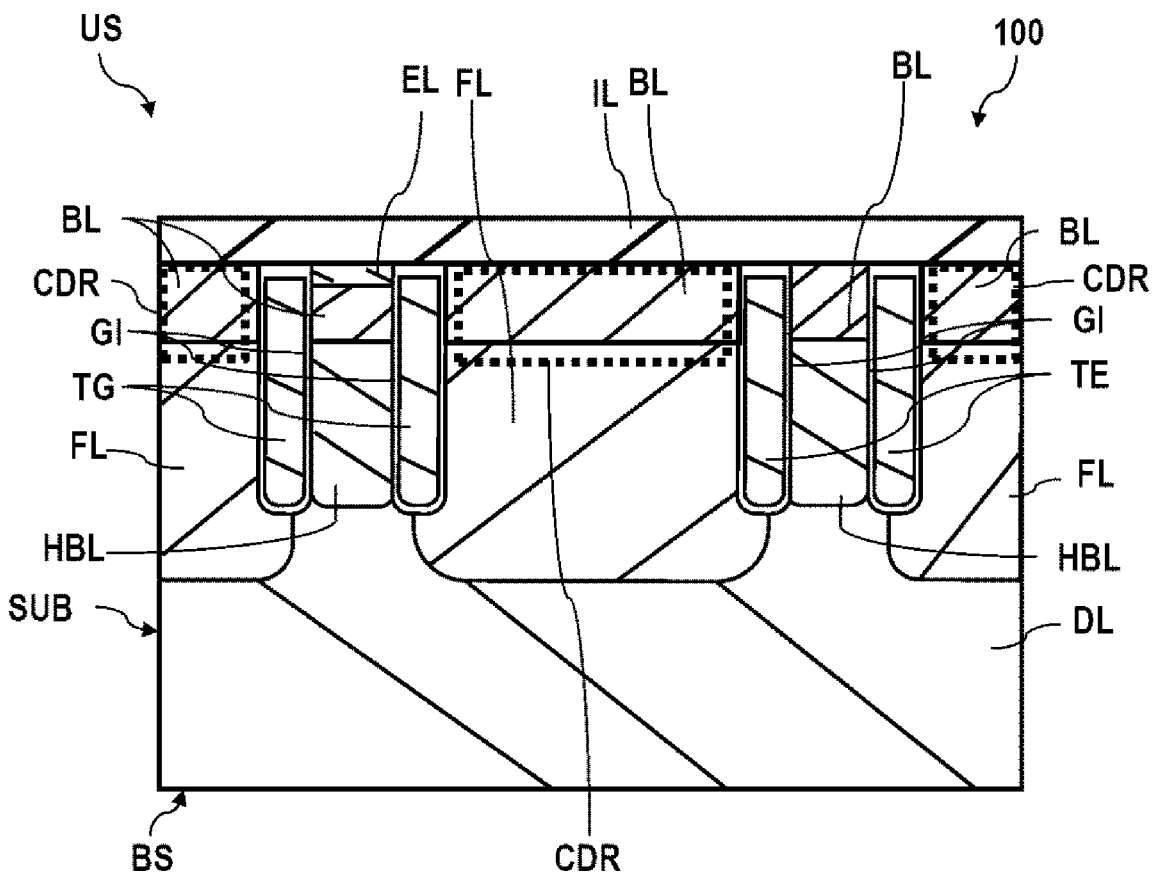
FIG. 18 is a cross-sectional view showing a step performed after the step shown in FIG. 17 in the embodiment.

Next, as shown in FIG. 18, an interlayer insulating film IL forming step is performed. First, the interlayer insulating film IL such as, for example, a silicon oxide film is formed on an insulating film on an upper surface of the floating region FL, the insulating film on the upper surface of the hole barrier region HBL, the trench gate TG and the trench emitter TE by, for example, CVD method.

Figure 19:
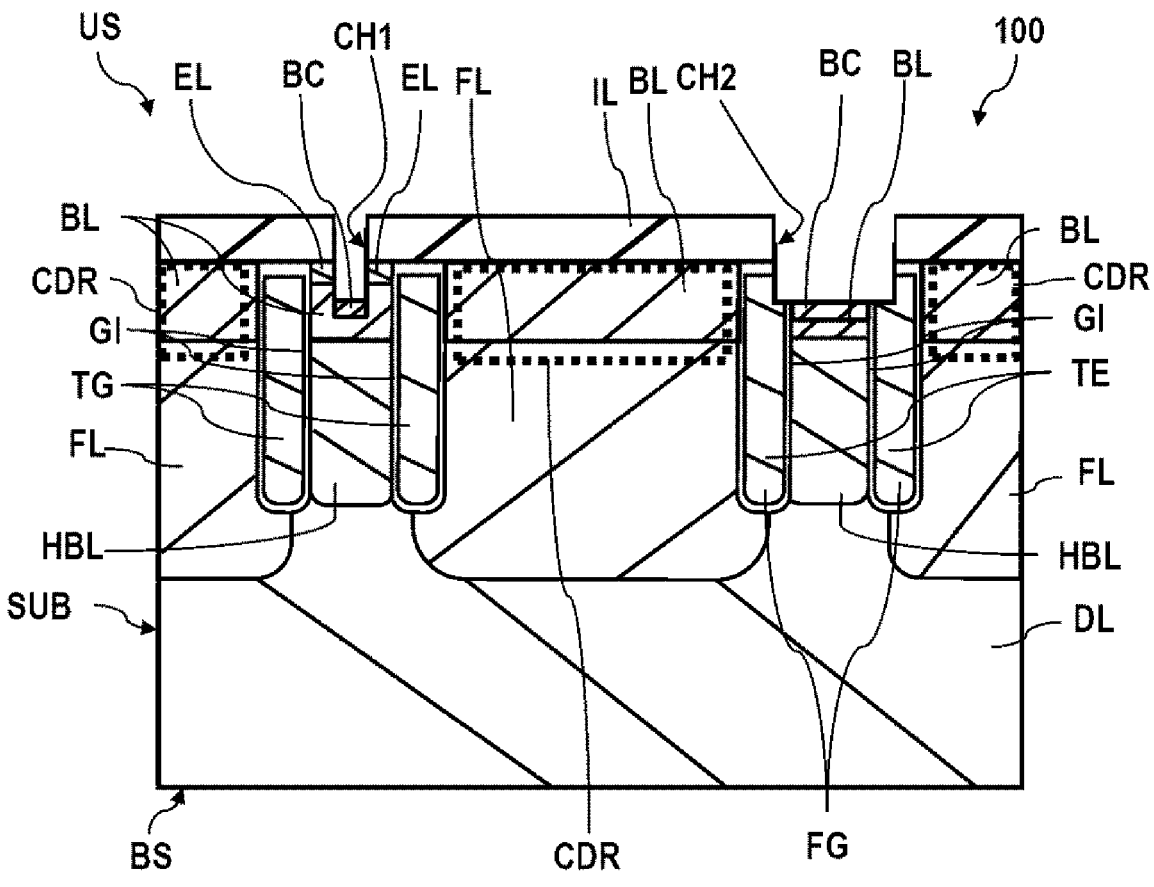
FIG. 19 is a cross-sectional view showing a step performed after the step shown in FIG. 18 in the embodiment.

Next, as shown in FIG. 19, a step of forming a first contact hole CH1, a second contact hole CH2, and the body contact region BC is performed.

By using photolithography and dry etching processes, for example, anisotropic dry etching, a first contact hole CH1 is formed in the active cell region that penetrates the interlayer insulating film IL and the emitter region EL and reaches the base region BL. Further, in the hole collector cell region, the second contact hole CH2 is formed so that penetrates the interlayer insulating film IL, and includes a recess such that the recess recesses on the semiconductor substrate SUB from the first main surface US toward the second main surface BS and straddles between the trench emitter TE and the base region BL.

Next, the body contact region BC is formed in the base region BL bottom each of the first contact hole CH1 and the second contact hole CH2 by using photolithography method and ion-implantation method. The body contact region BC is an impurity region having an impurity concentration higher than that of the base region BL. The body contact region BC of the active cell region is formed so as not to be in contact with the emitter region EL. An impurity for forming the body contact region BC is, for example, boron (B). Thereafter, heat treatment for activating each impurity region is performed. Note that, as needed, a heat treatment may be performed to activate the impurity regions and diffuse the impurity regions to a predetermined depth after a part or all of ion-implantation process.

Figure 20:
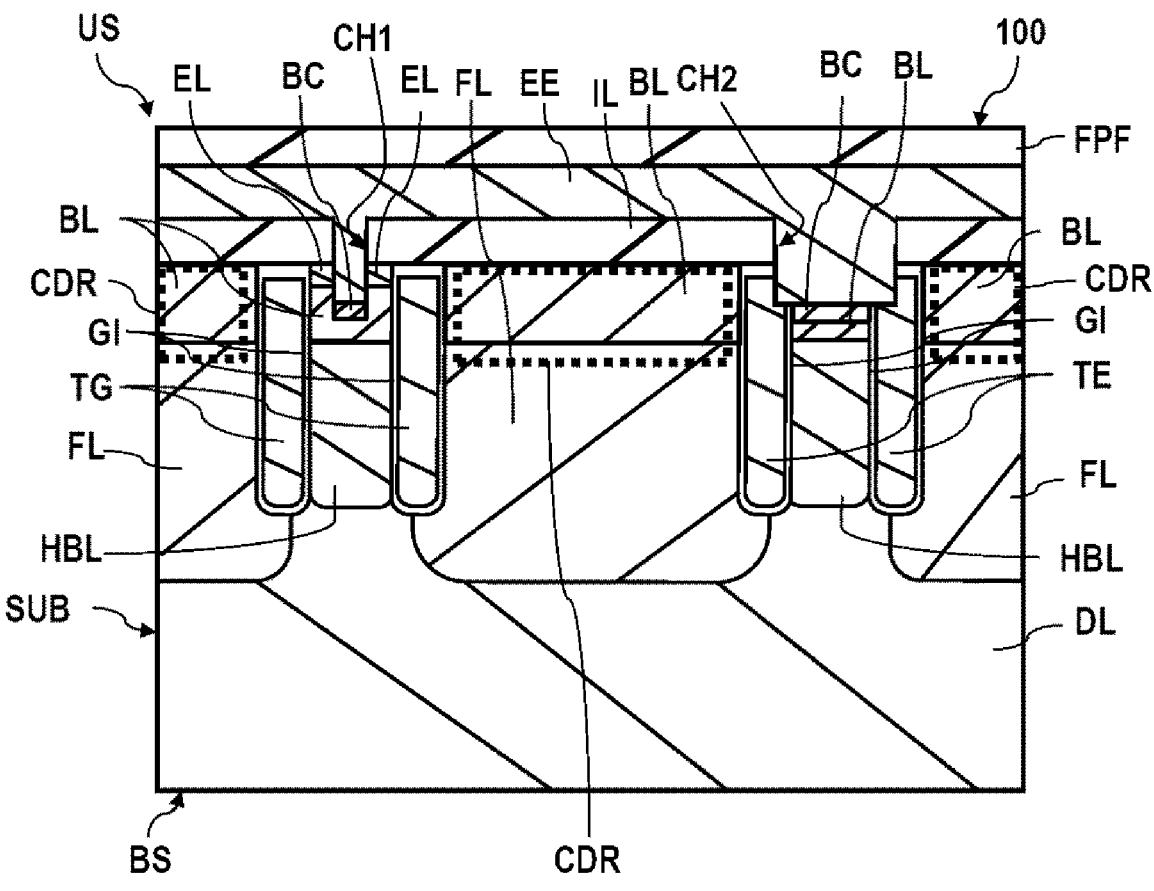
FIG. 20 is a cross-sectional view showing a step performed after the step shown in FIG. 19 in the embodiment.

Next, as shown in FIG. 20, a step of forming the emitter electrode EE and a final passivation film FPF is performed.

First, for example, an aluminum film, is formed on the interlayer insulating film IL by, for example, sputtering method so as to fill in the first contact hole CH1 and the second contact hole CH2. The aluminum film embedded in each contact holes CH1 and CH2 serve as contact members. Thereafter, the aluminum film is patterned by photolithography and dry etching to form the emitter electrode EE. At the same time, the gate electrode GE shown in FIG. 1 is also formed by patterning aluminum film. Further, prior to forming aluminum film, a barrier metal film made of, for example, a titanium nitride film or a titanium-tungsten film may be formed, and aluminum film may be formed on the barrier metal film. That is, the emitter electrode EE or the like may be a laminated film of a barrier metal film and an aluminum film.

Next, a step of forming the final passivation film FPF is performed. The final passivation film FPF is formed over the emitter electrode EE and over the interlayer insulating film IL. The final passivation film FPF is, for example, an organic film mainly composed of polyimide, and a thickness is, for example, about 10 micrometers. The final passivation film FPF is formed by coating the organic film over the upper side of the emitter electrode EE and the upper side of the interlayer insulating film IL, and opening a portion of the emitter pad EP and a portion of a gate pad GP by usual photolithography.

Figure 21:
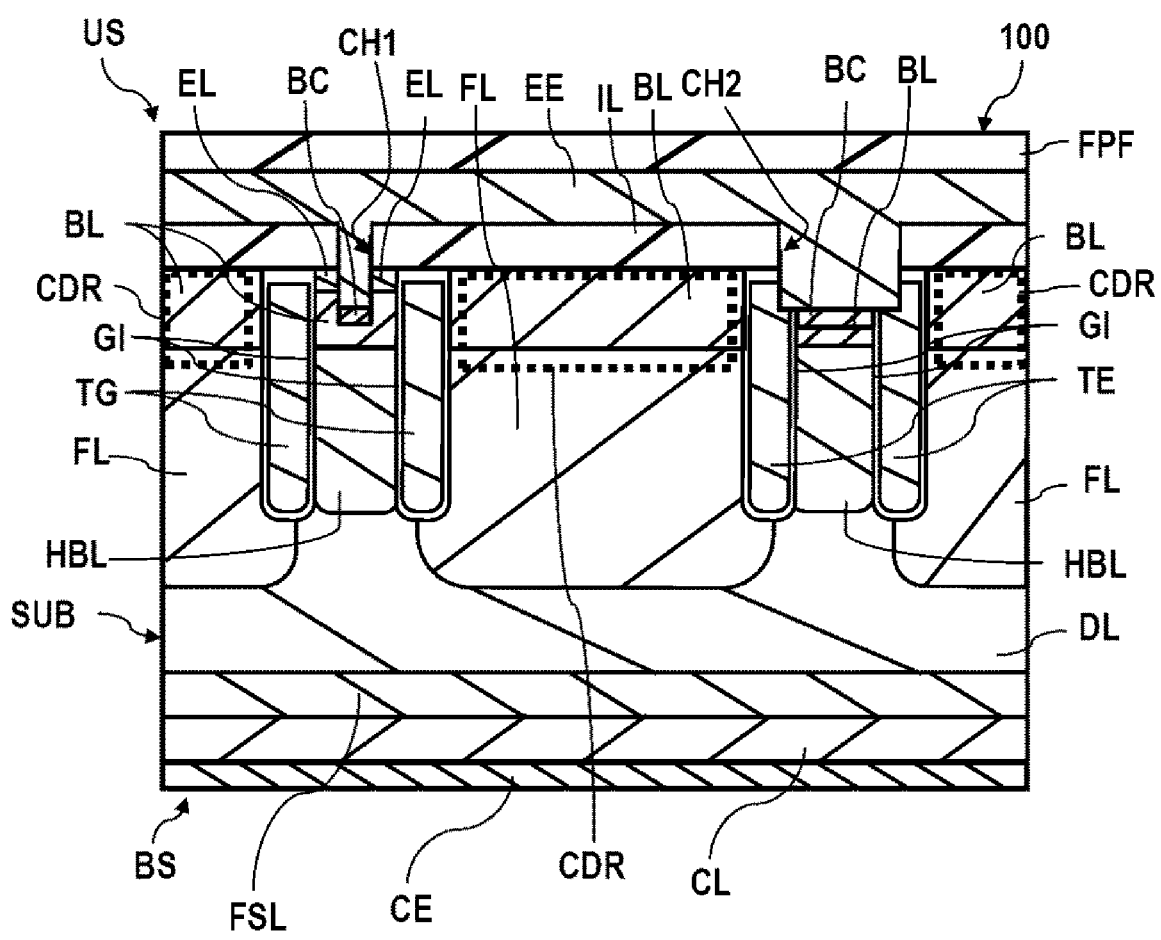
FIG. 21 is a cross-sectional view showing a step performed after the step shown in FIG. 20 in the embodiment.

Next, as shown in FIG. 21, a field stop layer FSL, a collector layer CL, and a collector electrode CE are formed the second main surface BS of the semiconductor substrate SUB.

First, a thickness of the semiconductor substrate SUB is reduced by performing a polishing process on bottom surface of the semiconductor substrate SUB as needed. Next, ion-implantation is performed from bottom surface of the semiconductor substrate SUB. By this ion-implantation, an n-type field stop region FSL and a p-type collector region CL are formed. The field stop region FSL is an impurity region having an impurity concentration higher than that of the drift layer DL. The impurity for forming the field stop region FSL is, for example, phosphorus (P). Impurities for forming the collector region PC is, for example, boron (B).

Next, on the surface of the collector region CL exposed on bottom surface side of the semiconductor substrate SUB, the collector electrode CE made of laminated film, such as a aluminum (Al) layer, a titanium (Ti) layer, a nickel (Ni) layer, and a gold (Au) layer, is formed, for example, by sputtering method or CVD method in this order.

While the invention made by the present inventor has been specifically described above based on the Embodiment, the present invention is not limited to the above-described embodiment and Embodiment, and it is needless to say that the present invention can be variously modified.

What is claimed is:

1. A semiconductor device comprising:
a semiconductor substrate having a first main surface and a second main surface opposite to the first main surface;
a first trench and a second trench formed on the semiconductor substrate;
a first trench emitter formed in the first trench via a first gate insulating film;
a first trench gate formed in the second trench via a second gate insulating film;
a floating region of a first conductivity type formed in the semiconductor substrate sandwiched between the first trench emitter and the first trench gate; and
a crystal defect region including crystal defects selectively formed at a position near the first main surface in the floating region, wherein
in cross-sectional view, the floating region is formed to cover a bottom surface of the first trench and a bottom surface of the second trench, and
in plan view and cross-sectional view, the crystal defect region separates apart from the first trench and the second trench.

2. The semiconductor device according to claim 1, wherein
the crystal defect region is located in the floating region and the crystal defect region does not contact with the first trench and the second trench.

3. The semiconductor device according to claim 1, further comprising:
a third trench formed beside the first trench and on the semiconductor substrate in a direction opposite to a direction in which the second trench is formed in plan view;
a second trench emitter formed in the third trench via a third gate insulating film;
a first base region of the first conductivity type formed in the semiconductor substrate sandwiched between the first trench emitter and the second trench emitter;
an interlayer insulating film formed on the first main surface such that the interlayer insulating film covers the first trench emitter, the second trench emitter, the first trench gate, the first base region and the crystal defect region;

a first contact member formed in the interlayer insulating film such that the first contact member penetrates through the interlayer insulating film and reaches the first main surface; and an emitter electrode formed on the interlayer insulating film, wherein the first contact member contacts with the first trench emitter, the second trench emitter, the first base region and the emitter electrode.

4. The semiconductor device according to claim 3, further comprising:

a first contact hole penetrated through the interlayer insulating film and reached the first main surface; and in the first contact hole, a recess formed from the first main surface toward the second main surface such that the recess traversed the first trench emitter, the first base region and the second trench emitter in plan view, wherein the first contact member is formed as to fill in the first contact hole and the recess.

5. The semiconductor device according to claim 3, further comprising:

a fourth trench formed beside the second trench and on the semiconductor substrate in a direction opposite to a direction in which the first trench is formed in plan view;

a second trench gate formed in the fourth trench via a fourth gate insulating film;

a second base region of the first conductivity type formed in the semiconductor substrate sandwiched between the first trench gate and the second trench gate;

an emitter region of a second conductivity type opposite to the first conductivity type formed in the first main surface and on the second base region;

a second contact member formed in the interlayer insulating film such that the second contact member penetrates through the interlayer insulating film and reaches the first main surface;

wherein the second contact member contacts with the emitter region, the second base region and the emitter electrode.

6. The semiconductor device according to claim 5, further comprising:

a gate electrode formed on the first main surface and electrically connected to the first trench gate and the second trench gate; and a collector electrode formed on the second main surface, wherein the emitter electrode electrically connects with the first trench emitter, the second trench emitter, the first base region, the second base region and the emitter region, and the emitter electrode, the gate electrode and the collector electrode configure an IGBT.

7. The semiconductor device according to claim 6, wherein the crystal defect region is formed in the floating region where is not depleted in an off-state of the IGBT.

8. The semiconductor device according to claim 1, wherein a high crystal defect density portion of the crystal defects in the crystal defect region is located near the first main surface.

9. The semiconductor device according to claim 1, wherein a maximum density of the crystal defects is $1 \times 103/cm2$ or less.

10. The semiconductor device according to claim 1, wherein the first trench emitter, and the first trench gate are extended in a first direction and located side by side in a second direction intersecting the first direction.

\* \* \* \* \*